(12) United States Patent
Shimizu et al.

(10) Patent No.: US 8,785,788 B2
(45) Date of Patent: Jul. 22, 2014

(54) WIRING BOARD WITH BUILT-IN ELECTRONIC COMPONENT AND METHOD FOR MANUFACTURING THE SAME

(75) Inventors: Keisuke Shimizu, Ogaki (JP); Yukinobu Mikado, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 78 days.

(21) Appl. No.: 13/273,532

(22) Filed: Oct. 14, 2011

(65) Prior Publication Data

US 2012/0186861 A1 Jul. 26, 2012

(30) Foreign Application Priority Data

Jan. 20, 2011 (JP) .................................. 2011-010310
Jul. 13, 2011 (JP) .................................. 2011-155278

(51) Int. Cl.
H05K 1/16 (2006.01)

(52) U.S. Cl.
USPC .......................................... 174/260; 174/262

(58) Field of Classification Search
CPC ............ H05K 1/00; H05K 1/16; H05K 1/18; H05K 1/182; H05K 1/183
See application file for complete search history.

(56) References Cited

U.S. PATENT DOCUMENTS

| | | | |
|---|---|---|---|
| 6,621,012 B2 * | 9/2003 | Crockett et al. ............... | 174/261 |
| 7,936,567 B2 * | 5/2011 | Takashima et al. ............ | 361/761 |
| 2002/0186552 A1 | 12/2002 | Kimura et al. | |
| 2003/0137056 A1 | 7/2003 | Taniguchi et al. | |
| 2004/0014317 A1 | 1/2004 | Sakamoto et al. | |
| 2007/0095471 A1 * | 5/2007 | Ito et al. ........................ | 156/293 |
| 2009/0205202 A1 | 8/2009 | Tanaka et al. | |
| 2009/0215231 A1 | 8/2009 | Inoue | |
| 2010/0155124 A1 * | 6/2010 | Kawamura et al. ........... | 174/260 |
| 2010/0212946 A1 | 8/2010 | Shimizu et al. | |
| 2010/0214752 A1 | 8/2010 | Shimizu et al. | |
| 2010/0224397 A1 | 9/2010 | Shimizu et al. | |
| 2010/0300602 A1 * | 12/2010 | Ichiyanagi et al. ......... | 156/89.12 |
| 2010/0300740 A1 | 12/2010 | Ichiyanagi et al. | |

FOREIGN PATENT DOCUMENTS

| | | |
|---|---|---|
| JP | 2002-204045 | 7/2002 |
| JP | 2002-246757 A | 8/2002 |
| JP | 2003-218525 A | 7/2003 |
| JP | 2009-194382 A | 8/2009 |
| JP | 2009-200389 A | 9/2009 |
| JP | 2010-212652 A | 9/2010 |

(Continued)

OTHER PUBLICATIONS

U.S. Appl. No. 13/307,480, filed Nov. 30, 2011, Mikado et al.

Primary Examiner — Ishwarbhai B Patel
(74) Attorney, Agent, or Firm — Oblon, Spivak, McClelland, Maier & Neustadt, L.L.P.

(57) ABSTRACT

A wiring board with a built-in electronic component includes a substrate having an opening portion and having a first surface and a second surface on the opposite side of the first surface, and an electronic component having a third surface and a fourth surface on the opposite side of the third surface and positioned in the opening portion of the substrate such that the third surface faces the same direction as the first surface of the substrate. The electronic component has a curved surface joining the fourth surface and a side surface of the electronic component, and the opening portion of the substrate has a tapered portion formed by a tapered surface of the substrate joining an inner wall of the opening portion and the first surface and tapering from the first surface toward the second surface.

22 Claims, 26 Drawing Sheets

(56) References Cited

FOREIGN PATENT DOCUMENTS

| | | |
|---|---|---|
| JP | 2011-14882 A | 1/2011 |
| TW | 200731908 | 8/2007 |
| TW | 200738092 | 10/2007 |
| WO | WO 00/63970 A1 | 10/2000 |

\* cited by examiner

WIRING BOARD WITH BUILT-IN ELECTRONIC COMPONENT AND METHOD FOR MANUFACTURING THE SAME

CROSS-REFERENCE TO RELATED APPLICATIONS

The present application claims priority to Japanese Patent Application No. 2011-010310 filed Jan. 20, 2011, and Japanese Patent Application No. 2011-155278 filed Jul. 13, 2011. The contents of specifications, scope of patent claims and drawings in Japanese Patent Application Nos. 2011-010310 and 2011-155278 are incorporated herein by reference in their entirety in the present application.

BACKGROUND OF THE INVENTION

1. Field of the Invention

The present invention relates to a wiring board with a built-in electronic component and its manufacturing method.

2. Discussion of the Background

Japanese Laid-Open Patent Publication No. 2002-204045 describes a method for manufacturing a wiring board with a built-in electronic component, including the following: forming an opening portion (cavity) in a core substrate; accommodating a capacitor in the opening portion; filling resin in a clearance between the core substrate and the capacitor in the opening portion; forming an insulation layer on both sides of the core substrate; and forming in each insulation layer a via conductor connected to an electrode of the capacitor. The publication also describes a wiring board with a built-in electronic component manufactured by such a method. The contents of Japanese Laid-Open Patent Publication No. 2002-204045 are incorporated herein by reference in their entirety in the present application.

SUMMARY OF THE INVENTION

According to one aspect of the present invention, a wiring board with a built-in electronic component includes a substrate having an opening portion and having a first surface and a second surface on the opposite side of the first surface, and an electronic component having a third surface and a fourth surface on the opposite side of the third surface and positioned in the opening portion of the substrate such that the third surface faces the same direction as the first surface of the substrate. The electronic component has a curved surface joining the fourth surface and a side surface of the electronic component, and the opening portion of the substrate has a tapered portion formed by a tapered surface of the substrate joining an inner wall of the opening portion and the first surface and tapering from the first surface toward the second surface.

According to another aspect of the present invention, a method for manufacturing a wiring board with a built-in electronic component has preparing a substrate having a first surface and a second surface on the opposite side of the first surface, preparing an electronic component having a third surface and a fourth surface on the opposite side of the third surface, the electronic component including a curved surface joining the fourth surface and a side surface of the electronic component, forming in the substrate an opening portion which accommodates the electronic component, forming in the opening portion of the substrate a tapered portion by forming a tapered surface of the substrate joining an inner wall of the opening portion and the first surface and tapering from the first surface toward the second surface, and positioning the electronic component in the opening portion such that the third surface of the electronic component faces in the same direction as the first surface of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
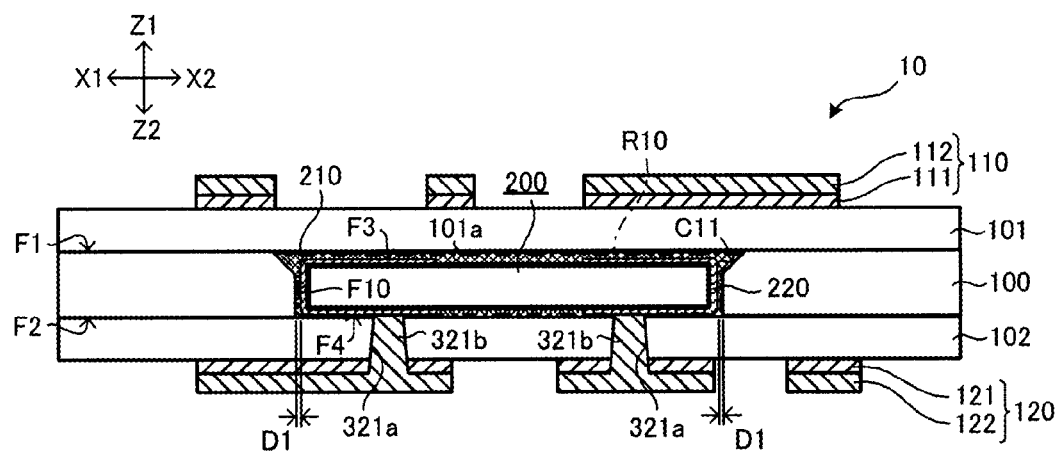
FIG. 1 is a cross-sectional view showing a wiring board with a built-in electronic component according to a first embodiment of the present invention.

The embodiments will now be described with reference to the accompanying drawings, wherein like reference numerals designate corresponding or identical elements throughout the various drawings.

Arrows (Z1, Z2) each indicate a lamination direction (or a thickness direction of the wiring board) corresponding to a direction along a normal line to main surfaces (upper and lower surfaces) of each layer. On the other hand, arrows (X1, X2) and (Y1, Y2) each indicate a direction perpendicular to a lamination direction (a direction parallel to main surfaces of each layer). Main surfaces of each layer are on the X-Y plane, and side surfaces of each layer are on the X-Z plane or the Y-Z plane.

Two main surfaces facing opposite directions of a normal line are referred to as a first surface or a third surface (a Z1-side surface) and a second surface or a fourth surface (a Z2-side surface). In lamination directions, the side closer to the core is referred to as a lower layer (or inner-layer side), and the side farther from the core is referred to as an upper layer (or outer-layer side). In addition, on the X-Y plane, the side farther away from a built-in electronic component (such as a capacitor) in the wiring board is referred to as outside, and the side closer to the electronic component is referred to as inside.

A conductive layer may include wiring that forms an electrical circuit (including ground), pad, land or the like; or it may include a planar conductive pattern (hereinafter referred to as a plain pattern) or the like that does not form an electrical circuit.

Opening portions include notches and cuts in addition to holes and grooves. Holes are not limited to penetrating holes, but also include non-penetrating holes. Holes include via holes and through holes. In the following, the conductor formed in a via hole is referred to as a via conductor, and the conductor formed in a through hole is referred to as a through-hole conductor.

Positioning an electronic component in an opening portion includes completely accommodating the entire electronic component in the opening portion as well as positioning only part of the electronic component in the opening portion.

Plating includes wet plating such as electrolytic plating as well as dry plating such as PVD (physical vapor deposition) and CVD (chemical vapor deposition).

Unless otherwise specified, the "width" of a hole or a column (protrusion) indicates the diameter if it is a circle, and $2\sqrt{\text{cross section}/\pi}$ if it is other than a circle.

Basically, whether or not an irregular measurement is in a predetermined range is determined by whether the average value of the measurement is within the range. However, such a definition does not apply if other values such as a maximum value are specified to be used instead of an average value.

In addition, to compare content amounts, weight per unit volume is used unless otherwise specified.

First Embodiment

Wiring board 10 according to a first embodiment is a wiring board with a built-in electronic component, and includes substrate 100, insulation layers (101, 102), conductive layers (110, 120) and electronic component 200 as shown in FIG. 1. Here, wiring board 10 of the present embodiment is a rigid wiring board. However, wiring board 10 may also be a flexible wiring board.

Substrate 100 is insulative and becomes the core substrate of wiring board 10. In the following, one of the upper and lower surfaces of substrate 100 (two main surfaces) is referred to as first surface (F1), and the other as second surface (F2).

Electronic component 200 is built into wiring board 10. In the following, one of the upper and lower surfaces of electronic component 200 (two main surfaces) is referred to as third surface (F3), and the other as fourth surface (F4).

Figure 2:
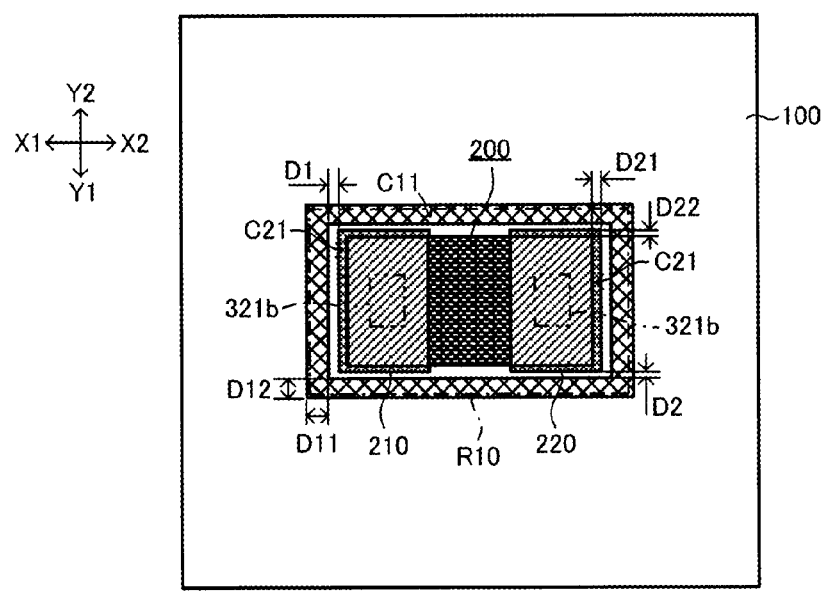
FIG. 2 is a plan view showing a state in which an electronic component is accommodated in an opening portion of a core substrate in a wiring board with a built-in electronic component according to the first embodiment of the present invention.

Opening portion (R10) is formed in substrate 100, and electronic component 200 is accommodated in opening portion (R10). FIG. 2 shows a state in which electronic component 200 is accommodated in opening portion (R10) of substrate 100 (core substrate).

Opening portion (R10) is a hole, which is partially tapered and which penetrates through substrate 100. The shape of a wider-side (Z1-side) opening of opening portion (R10) (hereinafter referred to as a first opening) and the shape of a narrower-side (Z2-side) opening (hereinafter referred to as a second opening) are each substantially rectangular. Here, the shape of the second opening corresponds to the shape of the region surrounded by side surfaces (F10) of substrate 100 facing opening portion (R10) (inner walls of opening portion (R10)). Electronic component 200 is, for example, a chip whose outline corresponds to the shape of the second opening of opening portion (R10) (such as a similar shape with substantially the same size), for example. The thickness of electronic component 200 substantially corresponds to the depth of opening portion (R10) (hole). In addition, the thickness of substrate 100 substantially corresponds to the thickness of electronic component 200.

As shown in FIG. 2, widths of electronic component 200 in directions X and Y are both set smaller than widths at the second opening of opening portion (R10). Predetermined clearances are secured to accommodate electronic component 200 in opening portion (R10). A clearance is obtained by subtracting the width of electronic component 200 from the width at the second opening of opening portion (R10). It is considered preferable for clearances in direction X and direction Y each to be in the range of approximately 0 μm to approximately 142 μm. "Approximately 142 μm" is a value obtained after considering the mounting accuracy and outline accuracy of a component.

Electronic component 200 is positioned in opening portion (R10) by setting third surface (F3) in the same direction as first surface (F1) of substrate 100. Electronic component 200 is positioned in opening portion (R10) so that it is set on a side of substrate 100 (in direction X or direction Y). In the present embodiment, substantially entire electronic component 200 is completely accommodated in opening portion (R10). However, that is not the only option, and electronic component 200 may be positioned only partially in opening portion (R10). In the present embodiment, insulator (101a) is filled in a clearance between electronic component 200 in opening portion (R10) and substrate 100. Insulator (101a) is made only of the resin that forms upper insulation layer 101, for example (see FIG. 16A). However, that is not the only option. Instead of, or in addition to, the resin of insulation layer 101 (resin insulation layer), material (such as resin) that forms substrate 100 or insulation layer 102 may be filled. Alternatively, insulative material prepared separately may be filled. In the present embodiment, insulator (101a) completely surrounds electronic component 200. In doing so, electronic component 200 is protected by insulator (101a) (resin) while it is fixed in a predetermined location.

Insulation layer 101 is formed on first surface (F1) of substrate 100 and third surface (F3) of electronic component 200. Insulation layer 102 is formed on second surface (F2) of substrate 100 and fourth surface (F4) of electronic component 200. Opening portion (R10) is a hole that penetrates through substrate 100, and insulation layer 101 covers one opening of opening portion (R10) (hole), and insulation layer 102 covers the other opening of opening portion (R10) (hole). Conductive layer 110 is formed on insulation layer 101, and conductive layer 120 is formed on insulation layer 102. In the present embodiment, conductive layers (110, 120) are the outermost layers. However, it is not the only option, and more interlayer insulation layers and conductive layers may also be further laminated.

Holes (321a) (via holes) are formed in insulation layer 102. By filling conductor (such as copper plating) in holes (321a), the conductors in holes (321a) become via conductors (321b) (filled conductors). Holes (321a) reach electrodes (210, 220) of electronic component 200, and via conductors (321b) in holes (321a) are electrically connected to electrodes (210, 220). Electrodes (210, 220) of electronic component 200 and conductive layer 120 on insulation layer 102 are electrically connected to each other by via conductors (321b).

Substrate 100, insulation layers (101, 102), and electronic component 200 are shaped in a rectangular sheet, for example. Main surfaces of electronic component 200 are shaped substantially rectangular, for example. However, those shapes are not the only option, and any other shape may be employed.

Substrate 100 is made by impregnating glass cloth (core material) with epoxy resin (hereinafter referred to as glass epoxy), for example. Core material has a lower thermal expansion coefficient than the main material (epoxy resin in the present embodiment). As for the core material, for example, inorganic materials such as follows are preferred: glass fiber (glass cloth, glass non-woven fabric or the like), aramid fiber (aramid non-woven fabric or the like) and silica filler. However, the shape, thickness, material and the like of substrate 100 are basically selected freely. For example, instead of epoxy resin, the following may also be used: polyester resin, bismaleimide triazine resin (BT resin), imide resin (polyimide), phenol resin, or allyl polyphenylene ether resin (A-PPE resin). Substrate 100 may be formed with multiple layers made of different materials.

Insulation layers (101, 102) are made of epoxy resin, for example. In the present embodiment, substrate 100 is made of resin with core material, and insulation layers (101, 102) are made of resin without core material. However, the present embodiment is not limited to such, and the shape, thickness, material and the like of insulation layers (101, 102) are basically determined freely. For example, instead of epoxy resin, the following may also be used: polyester resin, bismaleimide triazine resin (BT resin), imide resin (polyimide), phenol resin, allyl polyphenylene ether resin (A-PPE resin), or the like. Each insulation layer may be formed with multiple layers made of different materials.

Via conductor (321b) is made of copper plating, for example. Via conductor (321b) is shaped to be, for example, a tapered column (truncated cone) tapering with a diameter that increases from substrate 100 (core substrate) toward the upper layer, and a cross section of the via conductor (on the X-Y plane) is shaped to be substantially a perfect circle, for example. However, the via conductor is not limited to being shaped as above, and any other shape may be employed.

Conductive layer 110 is formed with copper foil 111 (lower layer) and copper plating 112 (upper layer), and conductive layer 120 is formed with copper foil 121 (lower layer) and copper plating 122 (upper layer). Conductive layers (110, 120) include wiring that forms electrical circuits (such as electrical circuits including electronic component 200), plain patterns to enhance the strength of wiring board 10, and the like.

However, materials for conductive layers and via conductors are not limited to the above, and any other material may also be used. Each conductive layer and each via conductor may be formed with multiple layers made of different materials.

Electronic component 200 is a chip capacitor, for example. Electronic component 200 has a thickness in the range of approximately 50 μm to approximately 300 μm, and its outline is shaped like a rectangular sheet with a length of each side in the range of approximately 0.5 mm to approximately 2 mm, for example. The shape of the main surfaces of electronic component 200 (third surface (F3) and fourth surface (F4)) is substantially rectangular, for example. However, that is not the only option, and the type, shape, measurements and the like of electronic component 200 are not limited specifically.

Figure 3:
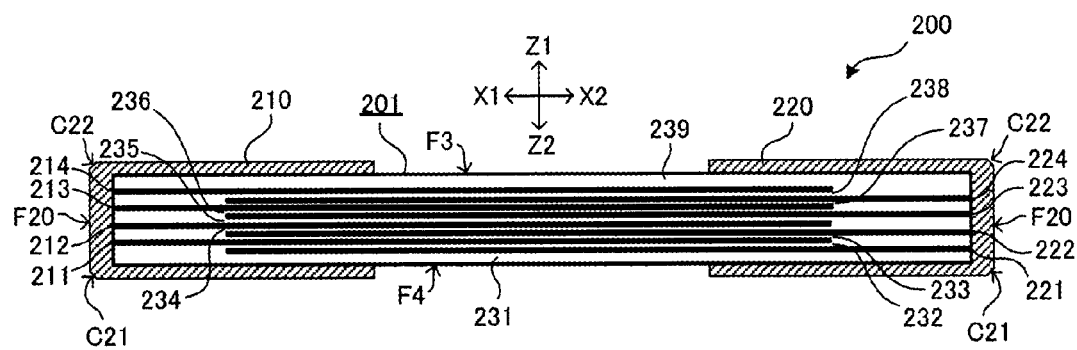
FIG. 3 is a cross-sectional view of an electronic component to be built into a wiring board.

As shown in FIG. 3, electronic component 200 has capacitor body 201 and U-shaped electrodes (210, 220). Capacitor body 201 is formed by alternately laminating multiple dielectric layers (231~239) and multiple conductive layers (211~214) and (221~224). Dielectric layers (231~239) are each made of ceramic, for example. Electrodes (210, 220) are formed on both ends of capacitor body 201 respectively. Accordingly, both ends of capacitor body 201, in particular, from fourth surface (F4) (lower surface) to a side surface and to third surface (F3) (upper surface), are covered with electrodes (210, 220).

Here, as shown in FIG. 2, since the center of capacitor body 201 positioned between electrode 210 and electrode 220 is not covered by electrodes (210, 220) and dielectric layers (231, 239) (ceramic) are exposed, its strength is relatively low. However, when electronic component 200 is mounted on (built into) wiring board 10, the center of capacitor body 201 is covered by insulator (101a) (resin). As a result, capacitor body 201 is protected by insulator (101a).

In a corner between first surface (F1) and side surface (F10) of substrate 100 facing opening portion (R10) (inner wall of opening portion (R10)) in wiring board 10 of the present embodiment, substrate 100 has tapered surface (C11), which reduces the width of opening portion (R10) from first surface (F1) toward second surface (F2).

Figure 4:
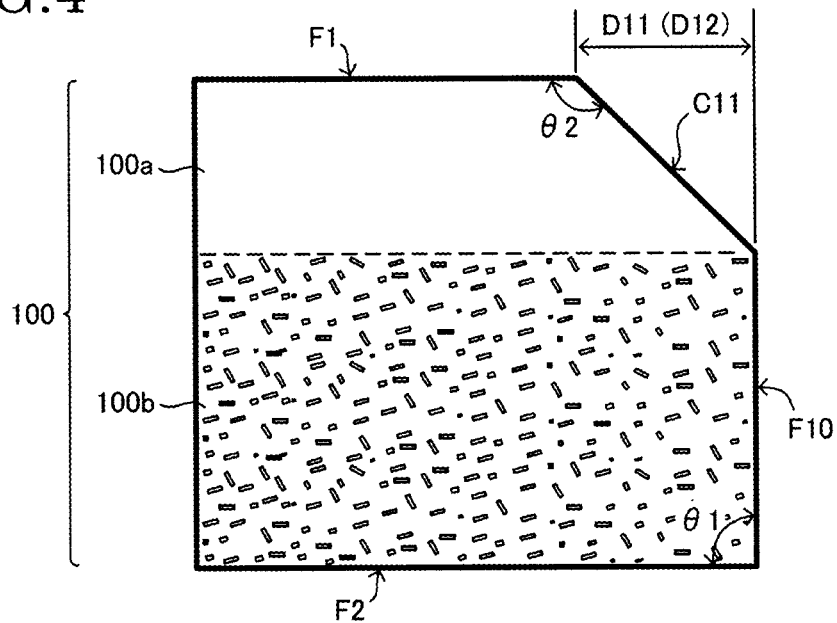
FIG. 4 is a cross-sectional view showing the shape of a tapered surface according to the first embodiment.

As shown in FIG. 4, substrate 100 is formed with first layer (100a) and second layer (100b), which are made of different materials. First layer (100a) and second layer (100b) are arranged from first surface (F1) to second surface (F2) in that order. Namely, second layer (100b) is formed on first layer (100a). In the present embodiment, first layer (100a) and second layer (100b) are each made of the same resin (such as epoxy resin), but second layer (100b) contains inorganic material (such as glass cloth) while first layer (100a) does not contain inorganic material.

Here, side surface (F10) of substrate 100 facing opening portion (R10) corresponds to a side surface of second layer (100b), first surface (F1) of substrate 100 corresponds to a main surface of first layer (100a), and tapered surface (C11) positioned in a corner of side surface (F10) and first surface (F1) corresponds to a side surface of first layer (100a). In FIG. 4 of the present embodiment, angle ($\theta1$) is set at approximately 90 degrees between second surface (F2) and side surface (F10) of substrate 100 facing opening portion (R10). Namely, side surface (F10) (an inner wall of opening portion (R10)) is a surface substantially perpendicular to second surface (F2).

As shown in FIG. 4, tapered surface (C11) is a plane (sloped surface) inclined against first surface (F1) of substrate 100. The angle between first surface (F1) of substrate 100 and tapered surface (C11) (hereinafter referred to as taper angle ($\theta2$)) is set at least greater than 90 degrees, and it is considered preferable for the angle to be in the range of approximately 120 degrees to approximately 150 degrees, more preferably at approximately 135 degrees. The rate to reduce the width of opening portion (R10) increases as taper angle ($\theta2$) increases.

Tapered surface (C11) is formed on the entire periphery (four sides) of opening portion (R10) as shown in FIG. 2, for example. However, that is not the only option, and tapered surface (C11) may be formed partially along the periphery of opening portion (R10) (see later-described FIG. 29). In the present embodiment, widths (D11, D12) of tapered surface (C11) are substantially constant. Namely, width (D11) along a direction X and width (D12) along a direction Y are substantially the same, for example. However, that is not the only option, and width (D11) along a direction X may be different from width (D12) along a direction Y.

Figure 5A:
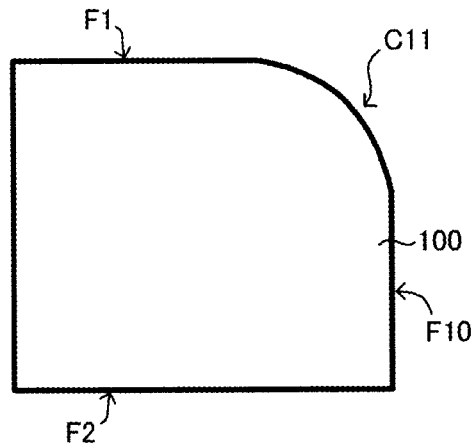
FIG. 5A is a cross-sectional view showing a first modified example of the shape of a tapered surface according to the first embodiment.
Figure 5B:
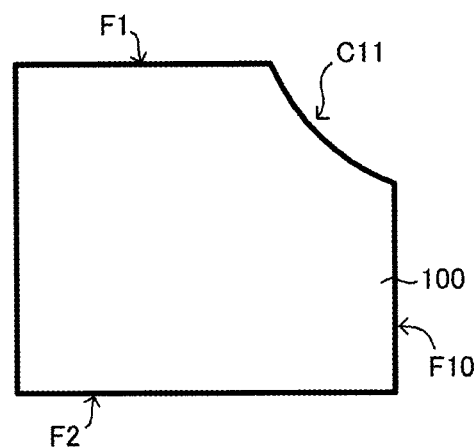
FIG. 5B is a cross-sectional view showing a second modified example of the shape of a tapered surface according to the first embodiment.

Its measurements, shape and the like of tapered surface (C11) are not limited to those above, and may be determined freely. It is sufficient if tapered surface (C11) reduces the width of opening portion (R10) from first surface (F1) toward second surface (F2). For example, as shown in FIG. 5A, tapered surface (C11) may be curved so that the rate of width reduction decreases as it goes from first surface (F1) toward second surface (F2). Alternatively, as shown in FIG. 5B, tapered surface (C11) may be curved so that the rate of width reduction increases as it goes from first surface (F1) toward second surface (F2).

In FIG. 2, measurement (D1) means the maximum value of a clearance in a direction X between substrate 100 and electronic component 200 (the greater value between the clearance on the X1 side and the clearance on the X2 side), and measurement (D2) means the maximum value of a clearance in a direction Y between substrate 100 and electronic component 200 (the greater value between the clearance on the Y1 side and the clearance on the Y2 side). Measurement (D1) or (D2) (more preferably both of them) is preferred to be in the range of approximately 0 μm to approximately 100 μm, and it is considered especially preferable to be in the range of approximately 0 μm to approximately 5 μm. If measurement (D1) or (D2) is approximately 100 μm or smaller (especially, approximately 5 μm or smaller), since the space that allows electronic component 200 to move in opening portion (R10) is reduced, the positional accuracy of electronic component 200 is enhanced. As a result, alignment accuracy is enhanced between electronic component 200 and via conductor (321b). In addition, it is easier to secure a region for forming wiring (conductive layers 301, 302, etc., shown in later-described FIG. 18) on substrate 100. Also, it is easier to enhance the flatness of insulation layers formed on substrate 100 (such as insulation layers 101, 102).

It is considered preferable for side surface (F10) of substrate 100 facing opening portion (R10) (inner wall of opening portion (R10)) to be a cut surface made by a laser. If it is a cut surface by a laser, it tends to be a smooth surface. In addition, using a laser to cut a predetermined portion of substrate 100 (the portion corresponding to opening portion (R10)), it is easier to form tapered surface (C11) simultaneously with opening portion (R10).

Figure 6A:
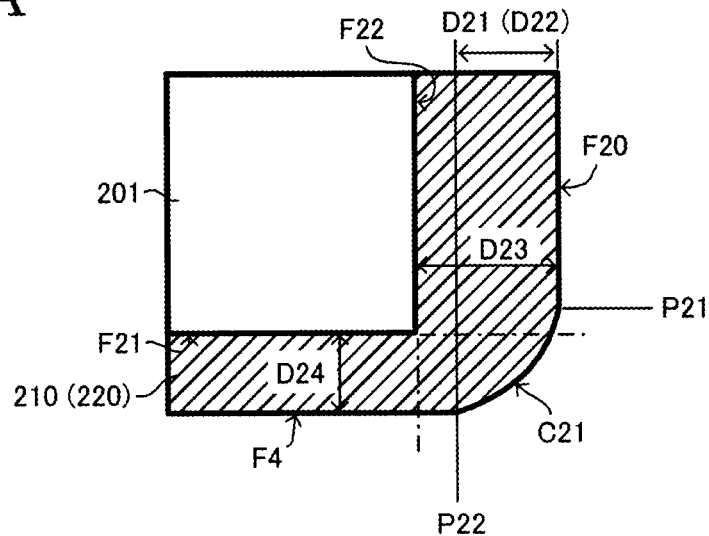
FIG. 6A is a cross-sectional view showing the shape of a curved surface of an electronic component according to the first embodiment.

As shown in FIGS. 3 and 6A, electronic component 200 has curved surface (C21) in a corner of side surface (F20) and fourth surface (F4). Each corner of capacitor body 201 is formed by two planes intersecting at right angles and is not curved. However, in a corner of fourth surface (F4) and side surface (F20) of electronic component 200, curved surface (C21) is formed from electrode 210 or 220, which covers surfaces of capacitor body 201.

Curved surface (C21) is formed from a surface of electrode 210 or 220 of electronic component 200. If curved surface (C21) has the strength of electrode material, the quality of electronic component 200 tends not to decrease even if curved surface (C21) touches tapered surface (C11) while electronic component 200 is being placed in opening portion (R10).

It is considered preferable for at least each of the surfaces of electrodes (210, 220) of electronic component 200 to be made of plated film. By adjusting plating conditions, even if a corner of capacitor body 201 does not have a curved surface, required curved surface (C21) is obtained easily on a surface of capacitor body 201. Also, smooth curved surface (C21) tends to be formed. If smooth curved surface (C21) is obtained, it is easier for electronic component 200 to slide on the surface. It is considered preferable for the radius of curvature at curved surface (C21) to be in the range of approximately 20 μm to approximately 40 μm. Especially it is more preferable to be approximately 30 μm. In the present embodiment, each corner of capacitor body 201 is formed by planes which intersect at right angles. However, that is not the only option, and a corner of capacitor body 201 may have a curved surface.

In the present embodiment, among corners of four side surfaces (F20) and fourth surface (F4) of electronic component 200, curved surfaces (C21) are formed where electrodes (210, 220) are positioned, as shown in FIG. 2. However, that is not the only option, and curved surfaces (C21) may be formed in any other way. In the present embodiment, widths (D21, D22) of curved surfaces (C21) are substantially constant. Namely, width (D21) along a direction X and width (D22) along a direction Y are substantially the same, for example. It is considered preferable for widths (D21, D22) to be each in the range of approximately 0 μm to approximately 71 μm. Such a value of approximately 71 μm is determined after considering the mounting accuracy and outline accuracy of a component. However, that is not the only value, and width (D11) along a direction X may have a different value from width (D12) along a direction Y.

Figure 6B:
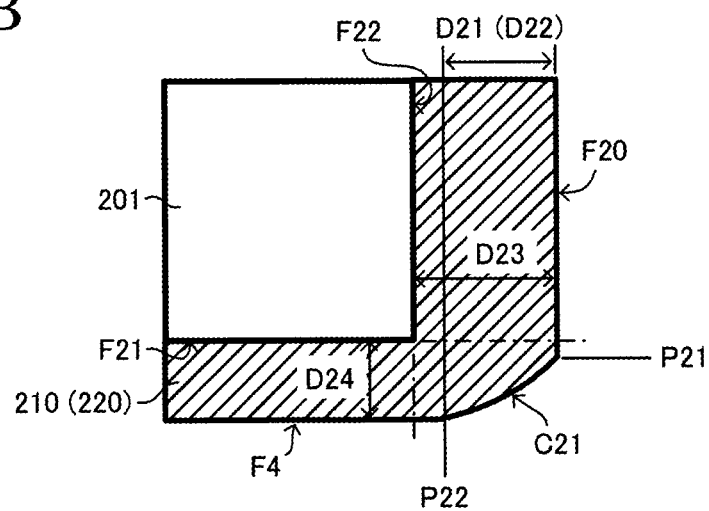
FIG. 6B is a cross-sectional view showing a first modified example of the shape of a curved surface of an electronic component according to the first embodiment.
Figure 6C:
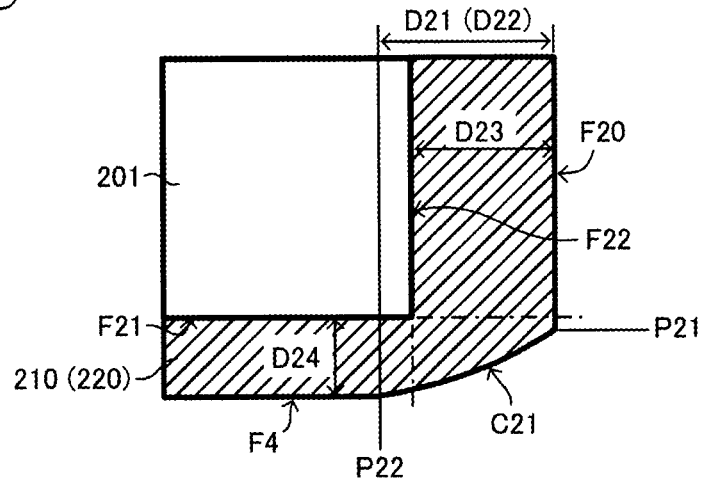
FIG. 6C is a cross-sectional view showing a second modified example of the shape of a curved surface of an electronic component according to the first embodiment.

In the present embodiment, boundary (P21) between curved surface (C21) and side surface (F20) of electronic component 200 is positioned further inside than lower surface (F21) of capacitor body 201, as shown in FIG. 6A. In addition, boundary (P22) between curved surface (C21) and fourth surface (F4) (lower surface) of electronic component 200 is positioned further outside than side surface (F22) of capacitor body 201. However, those are not the only options, and as shown in FIG. 6B, boundary (P21) may be positioned further outside than lower surface (F21), while boundary (P22) is positioned further outside than side surface (F22). Alternatively, as shown in FIG. 6C, boundary (P21) may be positioned further outside than lower surface (F21), while boundary (P22) is positioned further inside than side surface (F22).

As shown in FIG. 3, electronic component 200 of the present embodiment has curved surface (C22) in a corner of side surface (F20) and third surface (F3). Curved surface (C22) is shaped the same as curved surface (C21), for example. However, that is not the only option. For example, in a corner of side surface (F20) and third surface (F3), side surface (F20) and third surface (F3) (both are planar surfaces) may be intersected at right angles without a curved surface formed between them.

In FIG. 6A, it is considered preferable for thickness (D23) of electrodes (210, 220) on the side-surface (F20) side to be in the range of approximately 5 μm to approximately 30 μm. Also, it is considered preferable for thickness (D24) of electrodes (210, 220) on the fourth-surface (F4) side to be in the range of approximately 5 μm to approximately 30 μm.

As described above, wiring board 10 of the present embodiment has substrate 100 where opening portion (R10) is formed, and electronic component 200 positioned in opening portion (opening portion R10) in such as way that third surface (F3) faces the same direction as first surface (F1) of substrate 100. Electronic component 200 has curved surface (C21) in a corner of side surface (F20) and fourth surface (F4). In addition, in a corner of first surface (F1) and side surface (F10) facing opening portion (R10) (inner wall of opening portion R10), substrate 100 has tapered surface (C11), which reduces the width of opening portion (R10) from first surface (F1) toward second surface (F2). According to such a structure, it is easier to place electronic component 200 in opening portion (R10). In addition, it is easier to align electronic component 200 and via conductor (321b). Also, cracking is suppressed in electronic component 200.

Figure 7:
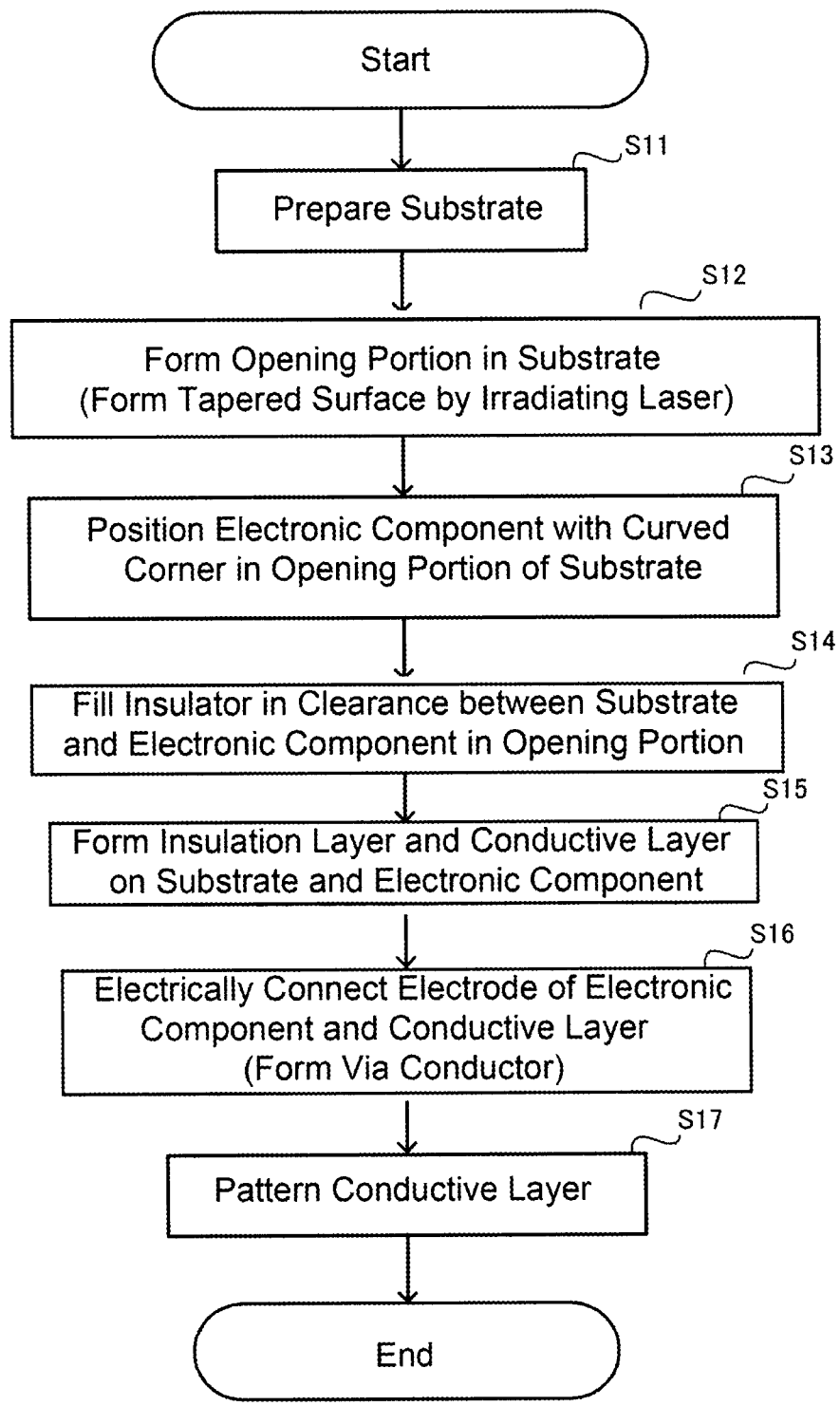
FIG. 7 is a flowchart showing a method for manufacturing a wiring board with a built-in electronic component according to the first embodiment of the present invention.

In the following, a method for manufacturing wiring board 10 is described with reference to FIG. 7 and others. FIG. 7 is a flowchart schematically showing the content and the order of a method for manufacturing wiring board 10 according to the present embodiment.

Figure 8:
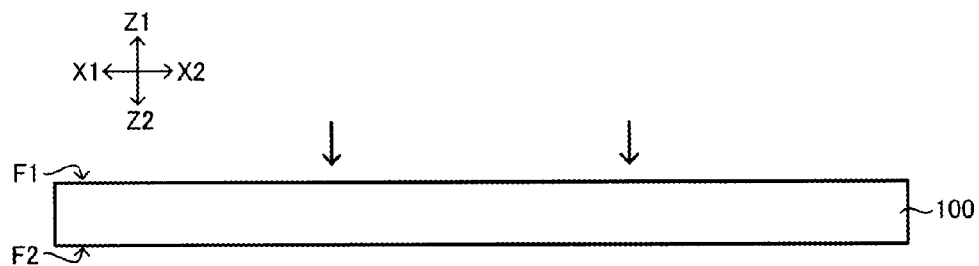
FIG. 8 is a cross-sectional view to illustrate a step for preparing a substrate in a manufacturing method according to the first embodiment.

In step (S11), substrate 100 (starting material) is prepared as shown in FIG. 8. Substrate 100 is completely cured glass epoxy, for example.

In step (S12) of FIG. 7, opening portion (R10) (FIGS. 1, 2) is formed in substrate 100.

Figure 9:
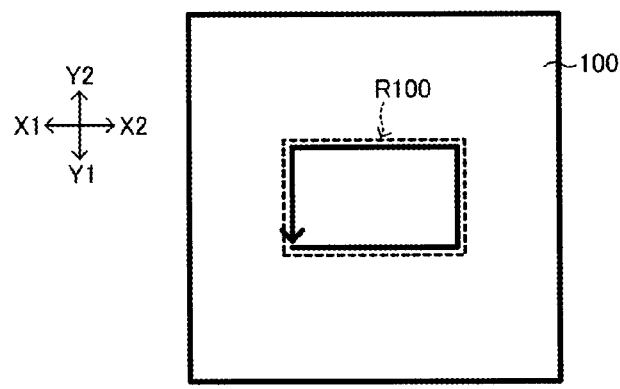
FIG. 9 is a plan view to illustrate a step for laser processing of the substrate subsequent to the step in FIG. 8.
Figure 10:
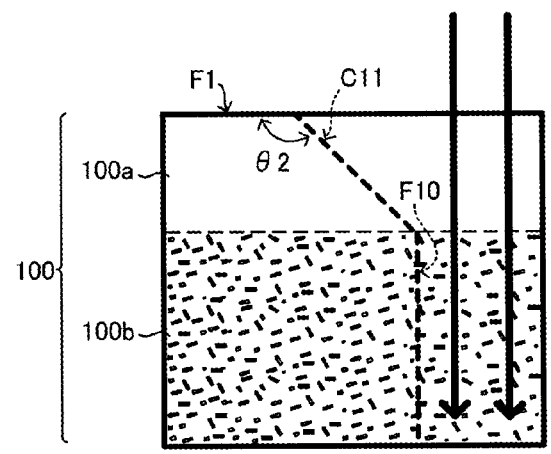
FIG. 10 is a cross-sectional view to illustrate laser processing according to the first embodiment.

Specifically, as shown in FIG. 9, for example, a laser is irradiated to draw a rectangle so that region (R100) of substrate 100 corresponding to opening portion (R10) is cut off from its surroundings. During that time, the laser is irradiated at first surface (F1) of substrate 100 so that it penetrates through first layer (100a) and reaches second layer (100b) as shown in FIG. 10. The irradiation angle of the laser is set substantially perpendicular to first surface (F1) of substrate 100, for example. Since second layer (100b) contains inorganic material while first layer (100a) does not contain inorganic material in the present embodiment, when the laser is irradiated, dissolution in directions X and Y advances in first layer (100a) so that tapered surface (C11) is obtained, while dissolution in directions X and Y hardly advances in second layer (100b) so that side surface (F10) (inner wall of opening portion R10) is formed substantially along a direction Z. Therefore, it is easy to form tapered surface (C11) in a corner of first surface (F1) and side surface (F10) of substrate 100 facing opening portion (R10).

Figure 11A:
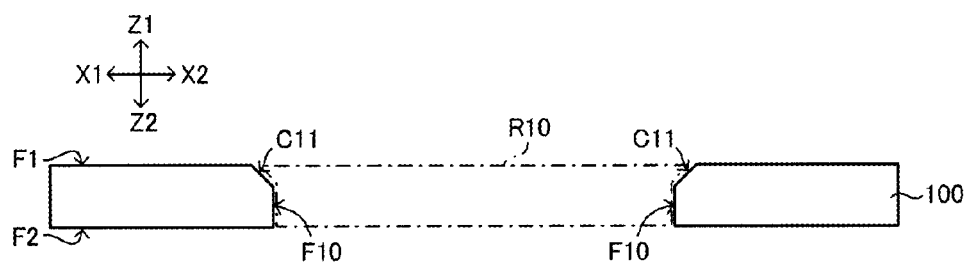
FIG. 11A is a cross-sectional view showing a substrate where an opening portion is formed by laser processing according to the first embodiment.

Opening portion (R10) is formed in substrate 100 by the above laser process as shown in FIG. 11A. Opening portion (R10) is made of a hole that penetrates through substrate 100. Tapered surface (C11) is positioned in a corner of first surface (F1) and side surface (F10) of substrate 100 facing opening portion (R10) (inner wall of opening portion (R10)), and reduces the width of opening portion (R10) from first surface (F1) toward second surface (F2). In the present embodiment, since opening portion (R10) is formed by a laser, it is easy to obtain opening portion (R10) having the structure previously described (see FIG. 4). Opening portion (R10) becomes a space to accommodate electronic component 200.

In step (S13) of FIG. 7, electronic component 200 having a curved-surface corner (an angle having curved surface C21) is positioned in opening portion (R10) of substrate 100.

Figure 11B:
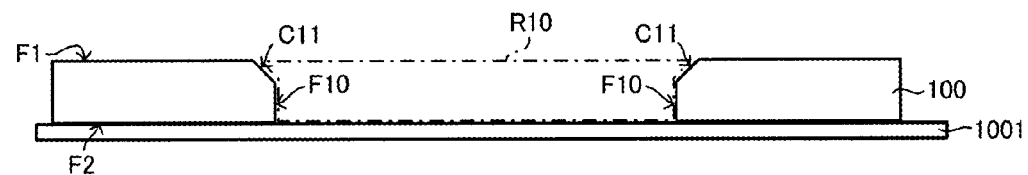
FIG. 11B is a cross-sectional view to illustrate a step for arranging a carrier on one side of the substrate in the manufacturing method according to the first embodiment.

Specifically, carrier 1001 made of PET (polyethylene terephthalate), for example, is arranged on one side of substrate 100 (second surface (F2), for example) as shown in FIG. 11B. Accordingly, one opening of opening portion (R10) (hole) is covered by carrier 1001. In the present embodiment, carrier 1001 is made of an adhesive sheet (such as a tape), and its adhesive side faces substrate 100. Carrier 1001 is adhered to substrate 100 by lamination, for example.

Figure 11C:
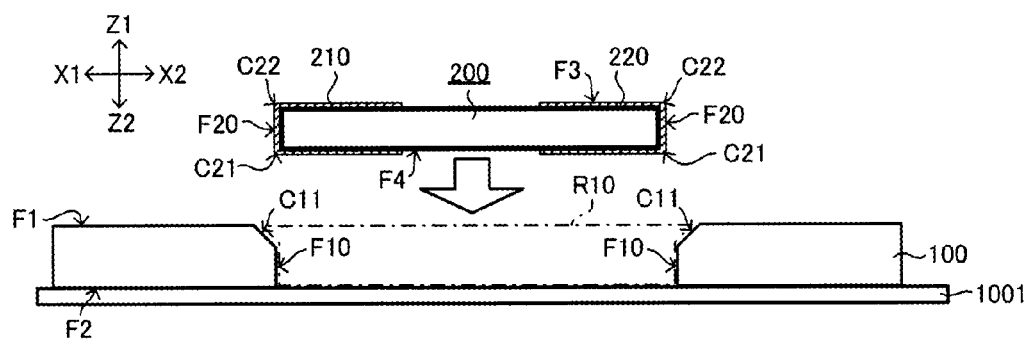
FIG. 11C is a cross-sectional view to illustrate a step for preparing an electronic component with a curved surface in the manufacturing method according to the first embodiment.

As shown in FIG. 11C, electronic component 200 is prepared, having curved surface (C21) in a corner of fourth surface (F4) and side surface (F20). Curved surface (C21) is formed from a surface of electrode 210 or 220 of electronic component 200. Electrodes (210, 220) of electronic component 200 are each made of plated film.

Electronic component 200 is placed in opening portion (R10) from the side (Z1 side) opposite the covered opening of opening portion (R10) (hole) so that electronic component 200 is positioned on carrier 1001 (adhesive sheet).

Figure 12A:
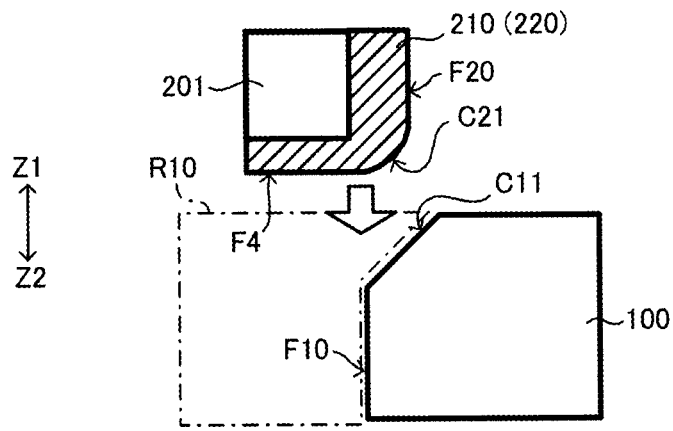
FIG. 12A is a cross-sectional view showing a first state in a step for placing the electronic component in the opening portion in the manufacturing method according to the first embodiment.
Figure 12B:
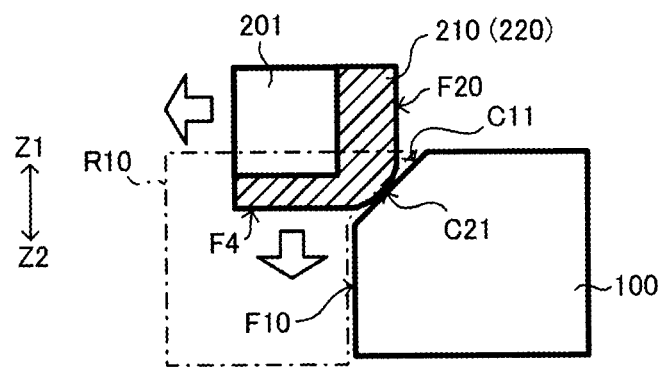
FIG. 12B is a cross-sectional view showing a second state subsequent to the first state shown in FIG. 12A.
Figure 12C:
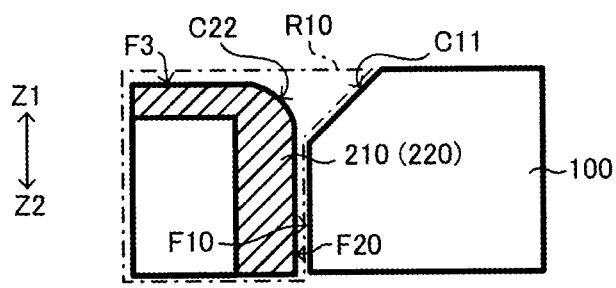
FIG. 12C is a cross-sectional view showing a third state subsequent to the second state shown in FIG. 12B.

Electronic component 200 is placed into opening portion (R10) by a component mounter, for example. For example, electronic component 200 is held on a vacuum chuck or the like, transported to the area above opening portion (R10) (Z1 side), lowered vertically from that area, and placed into opening portion (R10) as shown in FIG. 12A. When electronic component 200 is placed into opening portion (R10), a curved corner (curved surface C21) of electronic component 200 is set to face substrate 100. If the alignment of electronic component 200 and opening portion (R10) is slightly off due to variations in the mounting accuracy of the component, tapered surface (C11) of substrate 100 makes contact with curved surface (C21) of electronic component 200 as shown in FIG. 12B. While tapered surface (C11) and curved surface (C21) are in contact, electronic component 200 slides on tapered surface (C11) to be introduced into opening portion (R10), and is accommodated in opening portion (R10) of substrate 100 to sit stably as shown in FIG. 12C. Here, a direction Z corresponds to a vertical direction in FIGS. 12A-12C. Electronic component 200 may be placed manually or automatically using equipment. Also, electronic component 200 may be placed into opening portion (R10) by dropping electronic component 200 toward opening portion (R10) using gravity.

In the present embodiment, when electronic component 200 touches substrate 100, tapered surface (C11) does not touch a right-angle corner (an angle made by two planes intersecting substantially at right angles), but tapered surface (C11) touches curved surface (C21). Thus, impact on electronic component 200 is suppressed and cracking in electronic component 200 seldom occurs.

In the present embodiment, curved surface (C21) of electronic component 200 is in contact with tapered surface (C11) of substrate 100, while electronic component 200 is being positioned in opening portion (R10). Accordingly, electronic component 200 slides on tapered surface (C11) to be introduced into opening portion (R10) and electronic component 200 is positioned in opening portion (R10) of substrate 100 even if the alignment of electronic component 200 and opening portion (R10) is slightly off. In addition, slight pressure is sufficient to slide and accommodate the component.

Also, since it is easy to align electronic component 200 and opening portion (R10), clearances between opening portion (R10) and electronic component 200, namely, gaps (measurements D1, D2) between substrate 100 and electronic component 200, are easily set narrower. A remarkable improvement for that matter has been confirmed by the inventor(s).

In addition, by reducing gaps (measurements D1, D2) between substrate 100 and electronic component 200, the positional accuracy of electronic component 200 is enhanced. As a result, positional accuracy is also enhanced between electronic component 200 and via conductor (321b).

Also, since curved surface (C21) is formed from a surface of electrode 210 or 220 (plated film), electronic component 200 tends to slide on curved surface (C21). Accordingly, impact on electronic component 200 is suppressed and cracking or the like seldom occurs in electronic component 200.

Figure 13A:
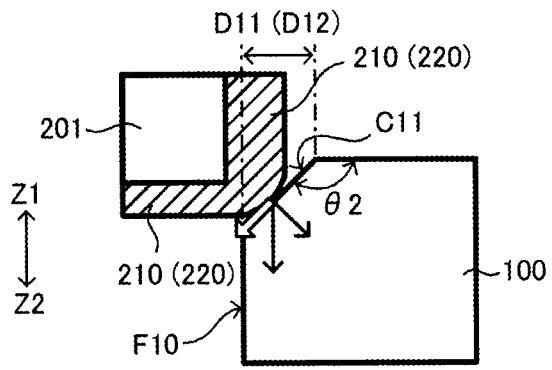
FIG. 13A is a cross-sectional view to illustrate an effect based on a first taper angle.
Figure 13B:
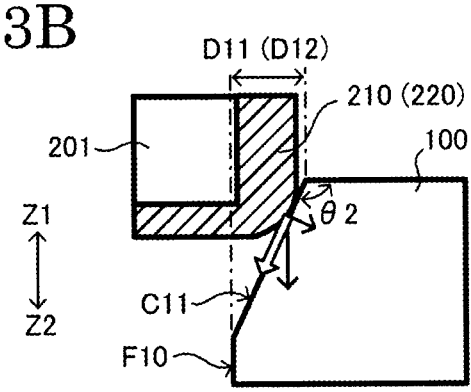
FIG. 13B is a cross-sectional view to illustrate an effect based on a second taper angle.
Figure 13C:
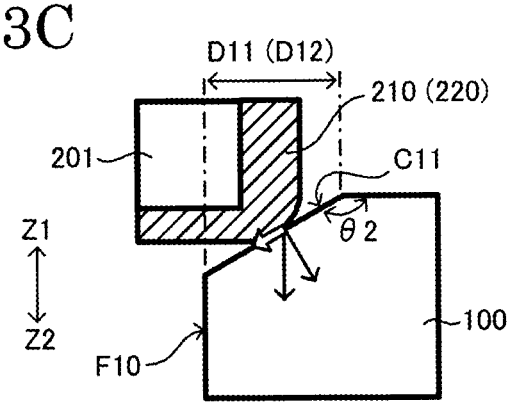
FIG. 13C is a cross-sectional view to illustrate an effect based on a third taper angle.

The following describes different effects on tapered surface (C11) based on differences in taper angle ($\theta 2$) by referring to FIGS. 13A-13C. Taper angle ($\theta 2$) is greatest in substrate 100 shown in FIG. 13C, second greatest in substrate 100 shown in FIG. 13A, and smallest in substrate 100 shown in FIG. 13B.

As shown in FIGS. 13A-13C, as taper angle ($\theta 2$) becomes smaller, the force required to introduce electronic component 200 into opening portion (R10) becomes greater. Also, as taper angle ($\theta 2$) becomes greater, electronic component 200 is more likely to fall onto tapered surface (C11), since width (D11) or (D12) of tapered surface (C11) is easily set greater.

Considering the above, taper angle (θ2) is preferred to be in the range of approximately 120 degrees to approximately 150 degrees, and is considered especially preferable to be approximately 135 degrees. If taper angle (θ2) is set as above, sufficient force is obtained to introduce electronic component 200 into opening portion (R10), while sufficient width (D11) or (D12) of tapered surface (C11) is obtained to align electronic component 200 and opening portion (R10).

Figure 14:
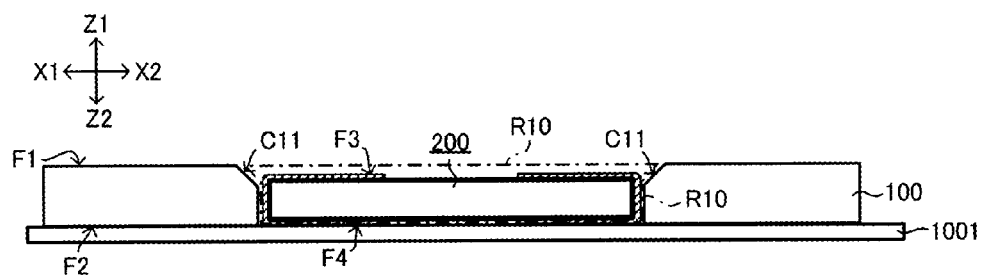
FIG. 14 is a cross-sectional view showing a state in which an electronic component is positioned in an opening portion of the substrate in the manufacturing method according to the first embodiment.

Electronic component 200 is positioned in opening portion (R10) by setting third surface (F3) in the same direction as first surface (F1) of substrate 100 (each in a direction Z) as shown in FIG. 14. Electronic component 200 is mounted on carrier 1001 and fixed (preliminarily fixed) by the adhesiveness of carrier 1001. By mounting electronic component 200 on carrier 1001, it is easier to set electronic component 200 horizontally.

Figure 15A:
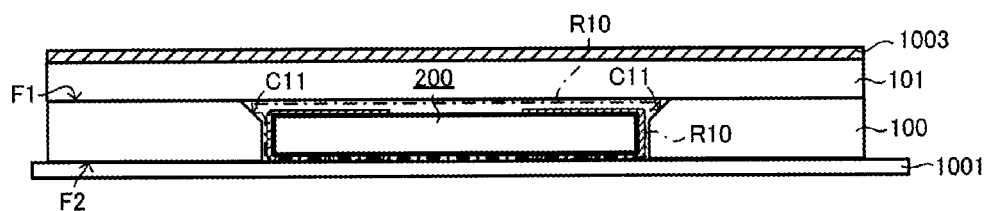
FIG. 15A is a view to illustrate a step for forming an insulation layer on the substrate and on the opening portion in the manufacturing method according to the first embodiment.
Figure 15B:
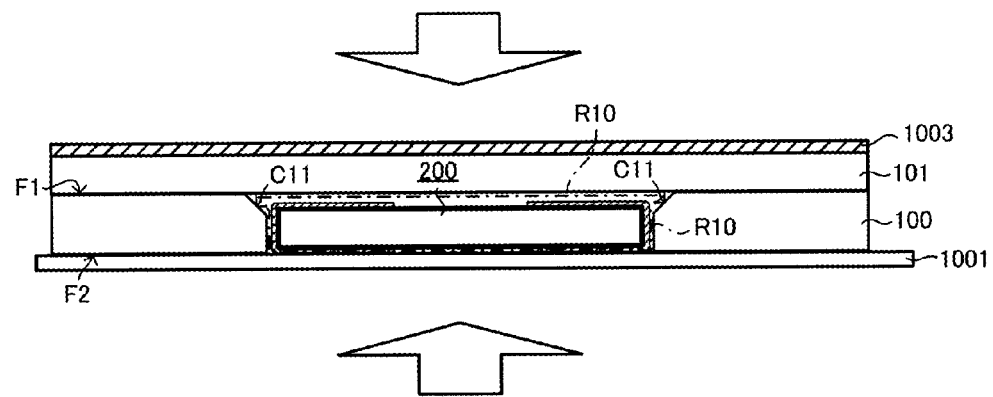
FIG. 15B is a view to illustrate a pressing step subsequent to the step in FIG. 15A.
Figure 16A:
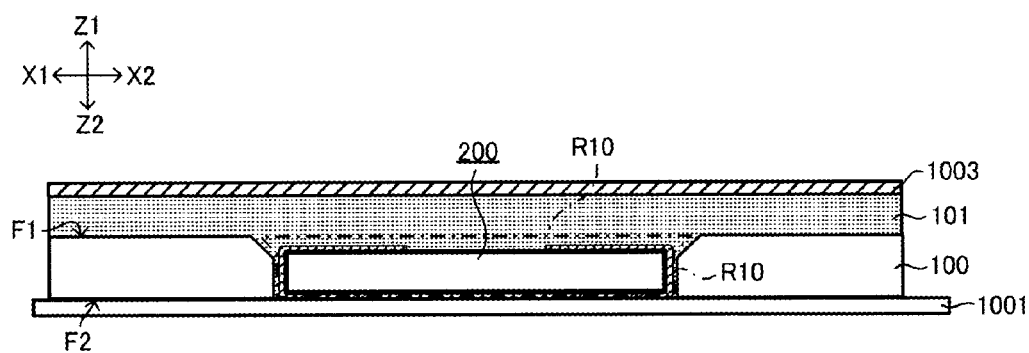
FIG. 16A is a view showing a state in which insulator is filled in the opening portion of the substrate by the pressing step in FIG. 15B.
Figure 16B:
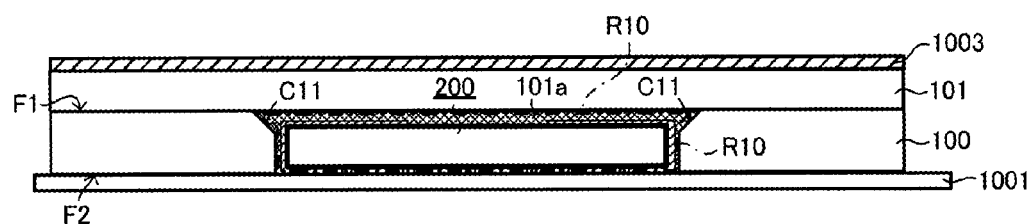
FIG. 16B is a view showing a state after the pressing step in FIG. 15B.

In step (S14) in FIG. 7, semicured insulation layer 101 is formed on substrate 100 and on electronic component 200, which is the opposite side (Z1 side) to the covered opening of opening portion (R10) (hole), as shown in FIG. 15A. Furthermore, copper foil 1003 is formed on insulation layer 101. Insulation layer 101 is made of prepreg of thermosetting epoxy resin, for example. By pressing semicured insulation layer 101 as shown in FIG. 15B, resin is flowed from insulation layer 101 into opening portion (R10) as shown in FIG. 16A. Accordingly, as shown in FIG. 16B, insulator (101a) (resin of insulation layer 101) is filled between electronic component 200 in opening portion (R10) and substrate 100. During that time, if gaps (measurements D1, D2) between substrate 100 and electronic component 200 are narrow, even if electronic component 200 is not fixed securely, the intensity of the resin flowing into opening portion (R10) is unlikely to cause shifting or unwanted inclining of electronic component 200. After opening portion (R10) is filled with insulator (101a), the filled resin (insulator 101a) and electronic component 200 are preliminarily adhered. Specifically, the filled resin is heated to gain retention power to a degree that it can support electronic component 200. In doing so, electronic component 200 supported by carrier 1001 is supported by the filled resin. Carrier 1001 is removed.

At this step, insulator (101a) (filled resin) and insulation layer 101 are not completely cured but are only semicured. However, that is not the only option. For example, insulator (101a) and insulation layer 101 may be completely cured at this stage.

In step (S15) of FIG. 7, buildup is conducted on each main surface.

Figure 17A:
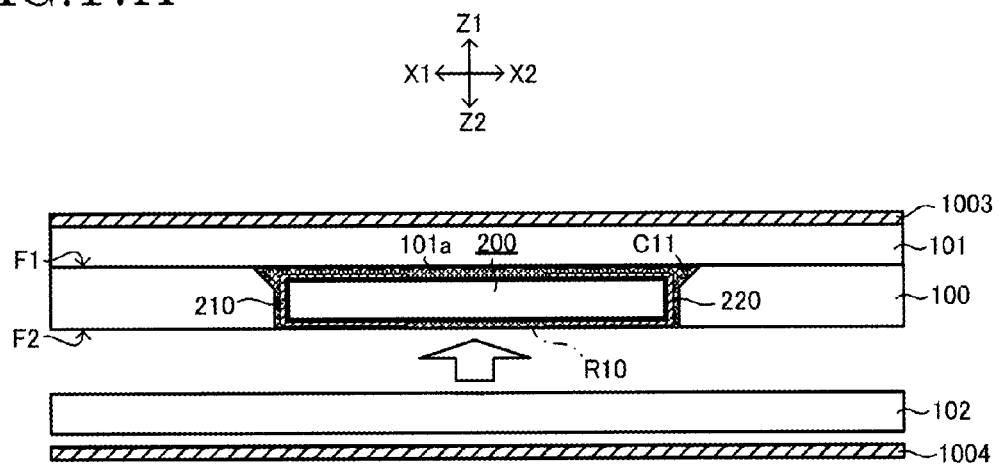
FIG. 17A is a view to illustrate a first step for a buildup in the manufacturing method according to the first embodiment.

Specifically, as shown in FIG. 17A, insulation layer 102 and copper foil 1004 are formed on second surface (F2) of substrate 100. Electrodes (210, 220) of electronic component 200 are each covered by insulation layer 102. After insulation layer 102 is adhered to substrate 100 through pressing while it is prepreg, for example, insulation layers (101, 102) are each thermally cured. In the present embodiment, since resin filled in opening portion (R10) is cured after the adhesive sheet (carrier 1001) is removed, insulation layers (101, 102) are cured simultaneously. By simultaneously curing insulation layers (101, 102) on both surfaces, warping is suppressed in substrate 100, making it easier to achieve thinner substrate 100.

Figure 17B:
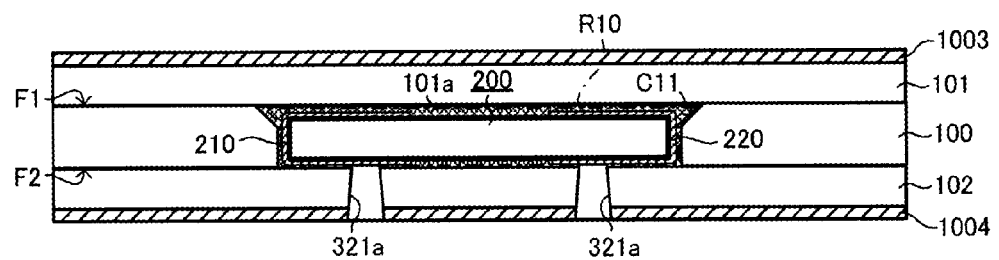
FIG. 17B is a view to illustrate a second step subsequent to the step in FIG. 17A.

In subsequent step (S16) of FIG. 7, a laser is used, for example, to form hole (321a) (via hole) in insulation layer 102 and copper foil 1004 as shown in FIG. 17B. Hole (321a) penetrates through insulation layer 102 and copper foil 1004, and reaches electrode 210 or 220 of electronic component 200. Desmearing is conducted if required.

Figure 17C:
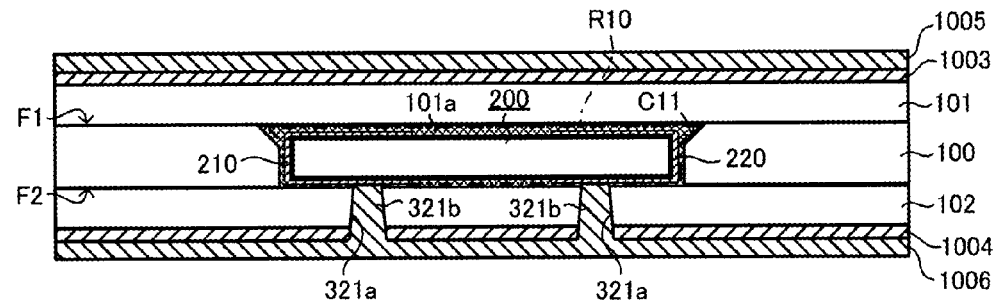
FIG. 17C is a view to illustrate a third step subsequent to the step in FIG. 17B.

As shown in FIG. 17C, using a panel plating method, for example, electrolytic copper plating 1005, for example, is formed on copper foil 1003, while electrolytic copper plating 1006, for example, is formed on copper foil 1004 and in hole (321a). The conductor in hole (321a) becomes via conductor (321b). By performing electroless plating prior to electrolytic plating, electroless plated film may be formed between copper foil 1003 and electrolytic plating 1005 or between copper foil 1004 and electrolytic plating 1006.

In step (S17) of FIG. 7, electrolytic platings (1005, 1006) are each patterned through etching, for example, so that conductive layers (110, 120) are formed. Accordingly, wiring board 10 of the present embodiment (FIG. 1) is completed. If required, electrical testing is conducted on electronic component 200 (checking capacity values, insulation and the like).

The manufacturing method according to the present embodiment includes the following: preparing substrate 100 (FIG. 8); preparing electronic component 200 which has curved surface (C21) in a corner of fourth surface (F4) and side surface (F20) (FIG. 11C); forming opening portion (R10) in substrate 100 (FIGS. 9, 10); in a corner of first surface (F1) and side surface (F10) of substrate 100 facing opening portion (R10) (inner wall of opening portion R10), forming tapered surface (C11) so that the width of opening portion (R10) decreases from first surface (F1) toward second surface (F2) (FIGS. 9, 10); and positioning electronic component 200 in opening portion (R10) by setting third surface (F3) in the same direction as first surface (F1) (FIGS. 12A-12C). According to such a manufacturing method, it is easier to place electronic component 200 in opening portion (R10). In addition, a clearance is set smaller between opening portion (R10) and electronic component 200. Also, it is easier to align electronic component 200 and via conductor (321b). Cracking is suppressed in electronic component 200.

In the above embodiment, tapered surface (C11) is formed by laser processing, but tapered surface (C11) may be obtained by other methods such as dry etching. However, an especially excellent tapered surface (C11) is obtained by laser processing. Moreover, because of first layer (100a) and second layer (100b) made of different materials, an excellent tapered surface (C11) is obtained without using special techniques such as laser irradiation from a diagonal direction.

Second Embodiment

A second embodiment of the present invention is described focusing on differences with the above first embodiment. Here, the same reference number is used for an element identical to the element shown in above FIG. 1 and others, and a common portion already described, namely, the portion whose description would be redundant, is omitted for the purpose of convenience.

Figure 18:
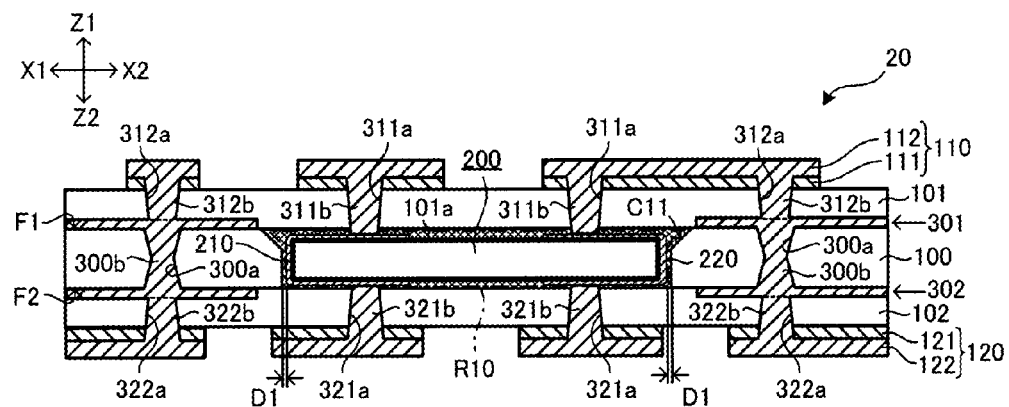
FIG. 18 is a cross-sectional view of a wiring board with a built-in electronic component according to a second embodiment of the present invention.

In wiring board 20 of the present embodiment, as shown in FIG. 18, through hole (300a) is formed in substrate 100 (core substrate), and through-hole conductor (300b) is formed by filling a conductor (such as copper plating) in through hole (300a). Through-hole conductor (300b) is shaped like an hourglass, for example. However, that is not the only option, and the shape of through-hole conductor (300b) may be substantially a column, for example.

Conductive layer 301 is formed on first surface (F1) of substrate 100, and conductive layer 302 is formed on second surface (F2) of substrate 100. Conductive layers (301, 302) each include a land of through-hole conductor (300b).

Holes (via holes) (311a, 312a) are formed in insulation layer 101, and holes (via holes) (321a, 322a) are formed in insulation layer 102. By filling a conductor (such as copper plating) in each of holes (311a, 312a, 321a, 322a), conductors in holes (311a, 312a, 321a, 322a) become via conductors (311b, 312b, 321b, 322b) (filled conductors) respectively. Via conductors (311b, 321b) are electrically connected respectively to electrodes (210, 220) of electronic component 200 either from the first-surface (F1) side or the second-surface (F2) side of substrate 100. As described, electronic component 200 is connected to via conductors (311b, 321b) from both of its surfaces in the present embodiment. Hereinafter, such a structure is referred to as a double-sided via structure.

Conductive layer 301 on first surface (F1) of substrate 100 and conductive layer 302 on second surface (F2) of substrate 100 are electrically connected to each other by through-hole conductor (300b). Via conductors (312b, 322b) and through-hole conductor (300b) are each a filled conductor, and they are stacked in a direction Z.

Conductive layer 301 on first surface (F1) of substrate 100 and conductive layer 110 on insulation layer 101 are electrically connected to each other by via conductor (312b). Also, conductive layer 302 on second surface (F2) of substrate 100 and conductive layer 120 on insulation layer 102 are electrically connected to each other by via conductor (322b).

Wiring board 20 of the present embodiment is also manufactured by the steps shown in FIG. 7, for example, the same as in the first embodiment.

Figure 19:
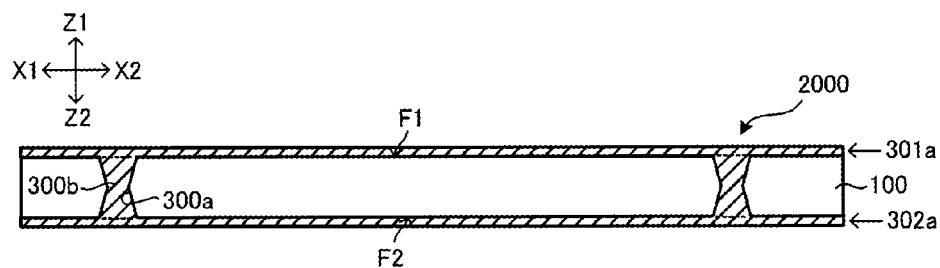
FIG. 19 is a cross-sectional view to illustrate a step for preparing a wiring board as a starting material in a manufacturing method according to the second embodiment.

In step (S11) of FIG. 7, wiring board 2000 (starting material) is prepared as shown in FIG. 19. In the present embodiment, wiring board 2000 is formed with the following: substrate 100; conductive layer (301a) formed on first surface (F1) of substrate 100; conductive layer (302a) formed on second surface (F2) of substrate 100; and through-hole conductor (300b). Substrate 100 is made of completely cured glass epoxy, for example. Conductive layers (301a, 302a) are each double-layered with copper foil (lower layer) and electrolytic copper plating (upper layer), for example.

Hourglass-shaped through hole (300a) is formed by irradiating a laser from both sides of substrate 100 (double-sided copper-clad laminate) with copper foils formed on both surfaces, for example. After forming copper foils on substrate 100 and forming through hole (300a) in substrate 100, conductive layers (301a, 302a) and through-hole conductor (300b) are formed by performing electrolytic copper plating, for example.

After irradiating the laser as above, it is considered preferable to conduct desmearing in through hole (300a). Unwanted conduction (short circuiting) is suppressed by desmearing. Also, it is considered preferable for surfaces of conductive layers (301a, 302a) to be roughened through etching or the like if required.

Figure 20A:
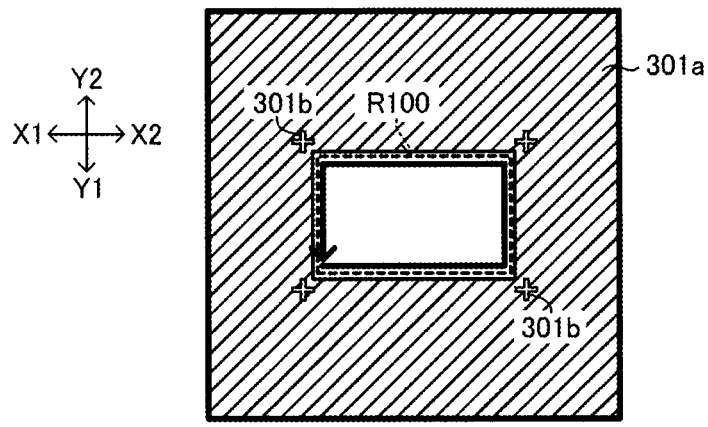
FIG. 20A is a plan view to illustrate a step for laser processing of a substrate subsequent to the step in FIG. 19.

In the present embodiment, conductive layer (301a) is not formed in region (R100) on substrate 100 corresponding to opening portion (R10) as shown in FIG. 20A. If conductive layer (301a) has such a conductive pattern, since the position and the shape of opening portion (R10) are clear, aligning laser irradiation is easier when forming opening portion (R10) in a later step (step (S12) in FIG. 7).

Figure 20B:
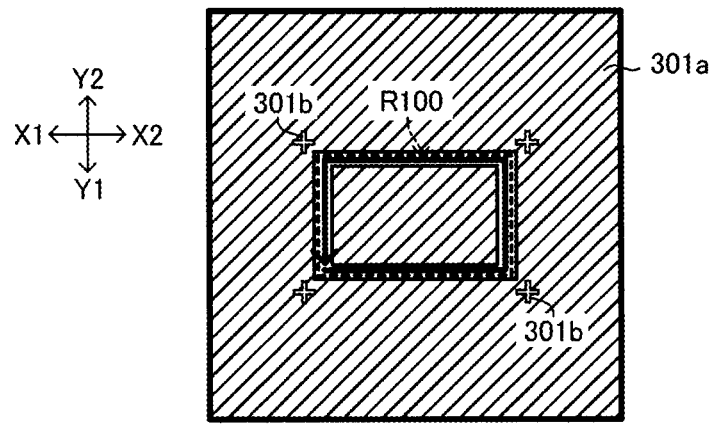
FIG. 20B is a plan view to illustrate a modified example of the laser processing according to the second embodiment.

However, the conductive pattern of conductive layer (301a) is not limited to the pattern shown in FIG. 20A. For example, it is an option to remove conductive layer (301a) only from the portion on substrate 100 to be irradiated by a laser (hereinafter referred to as a laser irradiation path) in a later step (step (S12) in FIG. 7) as shown in FIG. 20B. In such a case, conductive layer (301a) exists inside the laser irradiation path. When conductive layer (301a) is formed as above, aligning laser irradiation is also easier when forming opening portion (R10).

Also, as shown in FIG. 20A, conductive layer (301a) has alignment marks (301b) in the present embodiment. Alignment mark (301b) is a pattern optically recognizable in a later step (step (S13) in FIG. 7), for example, and is formed by partially removing the conductor through etching or the like, for example. In the present embodiment, alignment marks (301b) are arranged around region (R100) (four corners, for example). However, that is not the only option, and the positioning, shape and the like of alignment marks (301b) are not limited specifically.

Figure 21:
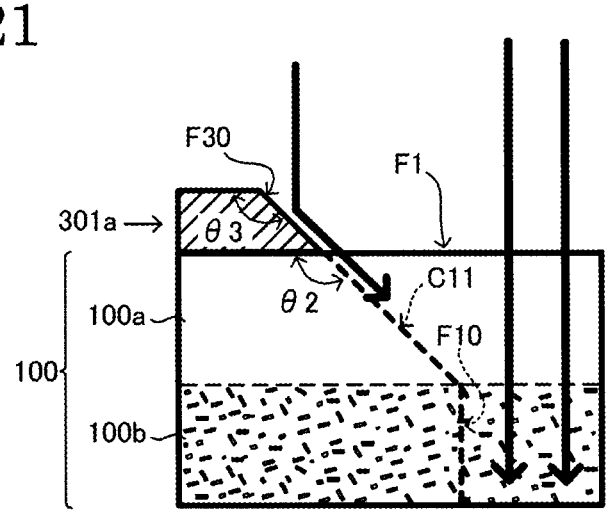
FIG. 21 is a cross-sectional view to illustrate laser processing according to the second embodiment.

In addition, in the present embodiment, side surface (F30) of conductive layer (301a) is tapered as shown in FIG. 21. It is considered preferable for taper angle (θ3) of side surface (F30) to be substantially the same as taper angle (θ2) of tapered surface (C11).

In step (S12) of FIG. 7, opening portion (R10) is formed in substrate 100. Specifically, as shown in FIG. 20A, for example, a laser is irradiated to draw a rectangle so that region (R100) of substrate 100 corresponding to opening portion (R10) is cut off from its surrounding portion. During that time, the laser is irradiated on first surface (F1) of substrate 100 as shown in FIG. 21 so that the laser penetrates through first layer (100a) and reaches second layer (100b). The laser irradiation angle is set substantially perpendicular to first surface (F1) of substrate 100, for example. If side surface (F30) of conductive layer (301a) is tapered, the laser is reflected by side surface (F30) and advances diagonally so that tapered surface (C11) tends to be formed.

By conducting steps (S13)~(S17) of FIG. 7, wiring board 20 of the present embodiment is manufactured (FIG. 18).

In the present embodiment, the position of electronic component 200 is determined using alignment marks (301b) in step (S13) of FIG. 7. By doing so, alignment accuracy is enhanced between electronic component 200 and opening portion (R10).

In addition, in step (S16) of FIG. 7, holes (311a, 312a, 322a) are formed in the same manner as in hole (321a) (see FIG. 17B), and via conductors (311b, 312b, 322b) are formed in the same manner as in via conductor (321b) (see FIG. 17C).

The manufacturing method of the present embodiment is suitable for manufacturing wiring board 20. Using such a manufacturing method, an excellent wiring board 20 is obtained at low cost.

Regarding the same structure and treatment as in the first embodiment, substantially the same effects are also achieved in the present embodiment as in the above-described first embodiment. For example, a preferred range of each measurement in wiring board 20 according to the second embodiment is the same as in wiring board 10 according to the first embodiment. From a standpoint of low cost and easy manufacturing, wiring board 10 with a simple structure is preferred over wiring board 20 according to the second embodiment. From a standpoint of high functionality and high performance, wiring board 20 with a double-sided via structure according to the second embodiment is preferred over wiring board 10 according to the first embodiment.

Other Embodiments

Figure 22A:
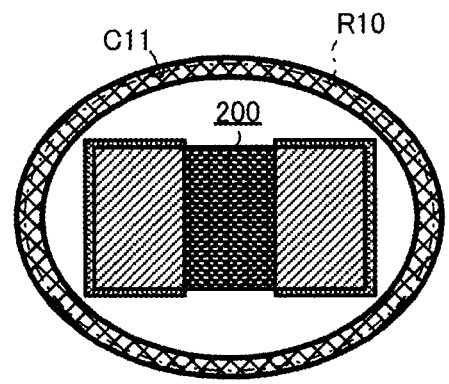
FIG. 22A is a plan view showing a first modified example of the shape of an opening portion.
Figure 22B:
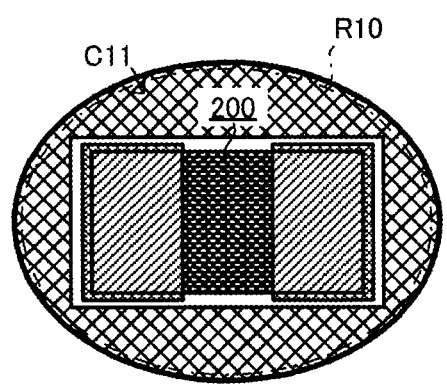
FIG. 22B is a plan view showing a second modified example of the shape of an opening portion.

The shape of main surfaces of electronic component 200 and the shapes of the first opening and the second opening of opening portion (R10) are not limited to being substantially rectangular, and they may be any other shape. For example, as shown in FIG. 22A, the shapes of the first opening and the second opening of opening portion (R10) may be substantially an ellipse. In addition, as shown in FIG. 22B, the shapes of the first opening and the second opening of opening portion (R10) may be in an asymmetrical relationship. In the example in FIG. 22B, the shape of the first opening of opening portion (R10) is substantially an ellipse, while the shape of the second opening of opening portion (R10) is substantially a rectangle.

Also, the shape of the main surfaces of electronic component 200 and the shapes of the first opening and the second opening of opening portion (R10) may be substantially a circle (substantially a perfect circle). Alternatively, other than substantially a rectangle, their shapes may be substantially a polygon such as substantially a square, substantially a regular hexagon, substantially a regular octagon, and the like. The shapes of angles of polygons are not limited specifically, and they may be substantially right, acute or obtuse, or even roundish, for example.

Figure 23:
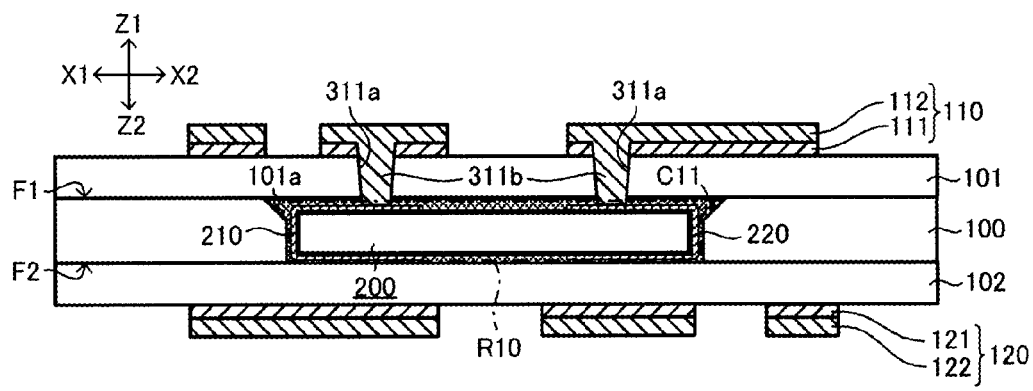
FIG. 23 is, regarding another embodiment, a cross-sectional view showing a wiring board with a built-in electronic component where a via conductor to be electrically connected to an electrode of an electronic component is positioned on a side of a core substrate with a tapered surface.

In wiring board 10 or 20 according to the above embodiments, via conductor (321b), which is electrically connected to electrode 210 or 220 of electronic component 200, is positioned on the second-surface (F2) side (the side opposite tapered surface (C11)). However, that is not the only option. For example, as shown in FIG. 23, it may be a wiring board where via conductor (311b) (the conductor in hole (311a) formed in insulation layer 101), which is electrically connected to electrode 210 or 220 of electronic component 200, is positioned on the first-surface (F1) side of substrate 100 (the side having tapered surface (C11)).

Figure 24:
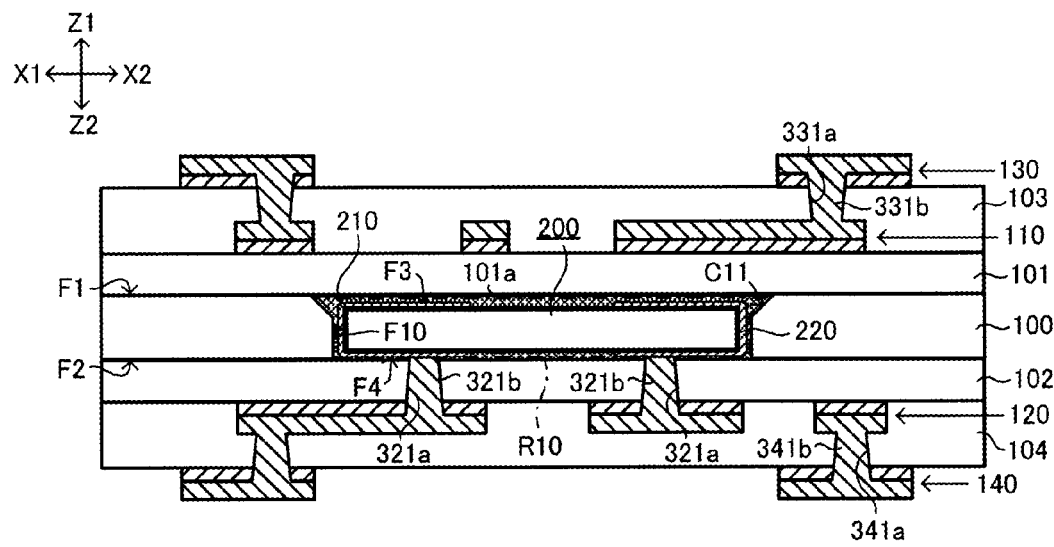
FIG. 24 is, regarding yet another embodiment, a cross-sectional view of a wiring board with a built-in electronic component having two or more buildup layers on one side of the core substrate.

It may also be a wiring board with a built-in electronic component having two or more buildup layers on one side of a core substrate. For example, as shown in FIG. 24, two insulation layers (101, 103) and two conductive layers (110, 130) may be alternately laminated on the first-surface (F1) side of substrate 100, and two insulation layers (102, 104) and two conductive layers (120, 140) may be alternately laminated on the second-surface (F2) side of substrate 100. In the example in FIG. 24, hole (331a) (via hole) is formed in insulation layer 103, and by filling a conductor (such as copper plating) in hole (331a), the conductor in hole (331a) becomes via conductor (331b) (filled conductor). Conductive layer 110 on insulation layer 101 and conductive layer 130 on insulation layer 103 are electrically connected to each other by via conductor (331b). Also, hole (341a) (via hole) is formed in insulation layer 104, and by filling a conductor (such as copper plating) in hole (341a), the conductor in hole (341a) becomes via conductor (341b) (filled conductor). Conductive layer 120 on insulation layer 102 and conductive layer 140 on insulation layer 104 are electrically connected to each other by via conductor (341b).

The number of buildup layers may be different on the first-surface (F1) side of substrate 100 and the second-surface (F2) side of substrate 100. However, to mitigate stress, it is considered preferable to enhance symmetry on the upper and lower surfaces by setting the numbers of the buildup layers the same on the first-surface (F1) side of substrate 100 and the second-surface (F2) side of substrate 100.

Figure 25:
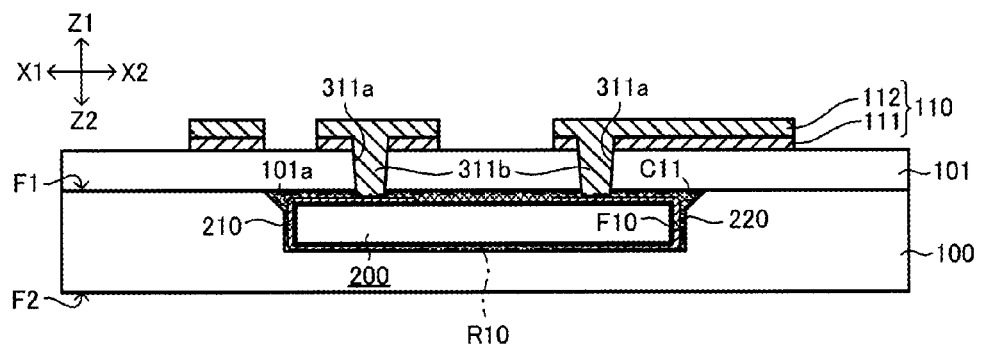
FIG. 25 is, regarding yet another embodiment, a cross-sectional view showing a first example of a wiring board with a built-in electronic component having a conductive layer only on one side of the core substrate.
Figure 26:
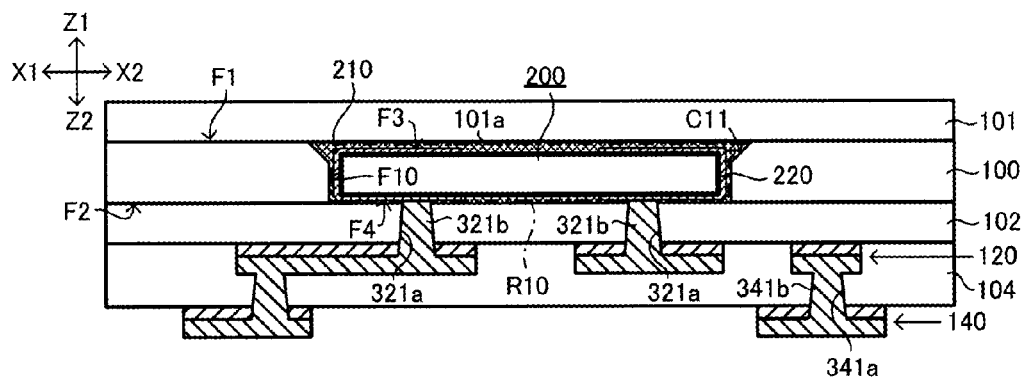
FIG. 26 is, regarding yet another embodiment, a cross-sectional view showing a second example of a wiring board with a built-in electronic component having a conductive layer only on one side of the core substrate.

In each of the above embodiments, a double-sided wiring board (wiring board 10) having conductive layers on both sides of a core substrate is shown. However, that is not the only option. For example, as shown in FIG. 25, it may be a single-sided wiring board having a conductive layer only on one side of a core substrate (substrate 100). Alternatively, FIG. 25 shows a single-sided wiring board having conductive layer 110 only on the first-surface (F1) side (the side having tapered surface (C11)), but that is not the only option. For example, as shown in FIG. 26, it may be a single-sided wiring board having conductive layers (120, 140) only on the second-surface (F2) side (the side opposite tapered surface (C11)).

Also, as shown in FIG. 25, for example, opening portion (R10) (accommodation space for electronic component 200) may be a hole that does not penetrate through substrate 100 (concave). In such a case as well, it is considered preferable for the thickness of electronic component 200 to be substantially the same as the depth of opening portion (R10) (hole).

Each of the above embodiments shows an example in which the thickness of substrate 100 is substantially the same as the thickness of electronic component 200. However, the embodiments are not limited to such. For example, as shown in FIG. 25, the thickness of substrate 100 may be greater than the thickness of electronic component 200.

Figure 27:
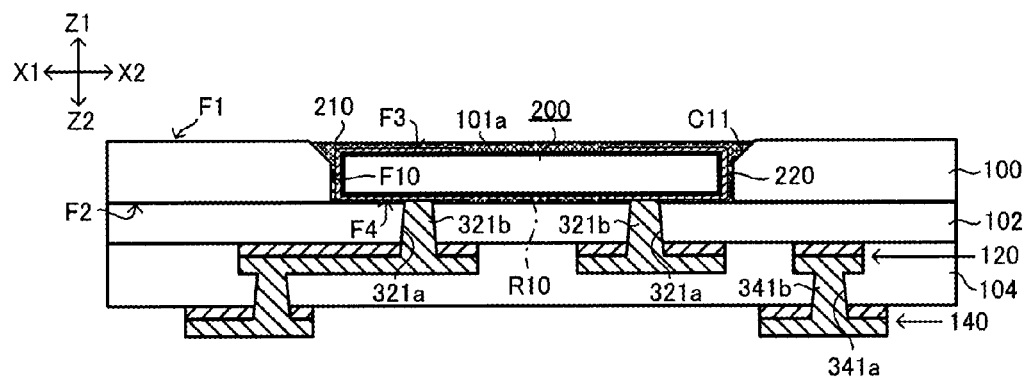
FIG. 27 is a cross-sectional view showing a wiring board with a built-in electronic component having an opening portion on a surface.

As shown in FIG. 27, a wiring board may have opening portion (R10) on its surface. In the example in FIG. 27, insulator (101a) is filled in the gap between electronic component 200 in opening portion (R10) and substrate 100. However, that is not the only option. For example, electronic component 200 may be partially fixed to substrate 100 using an adhesive or the like.

Figure 28:
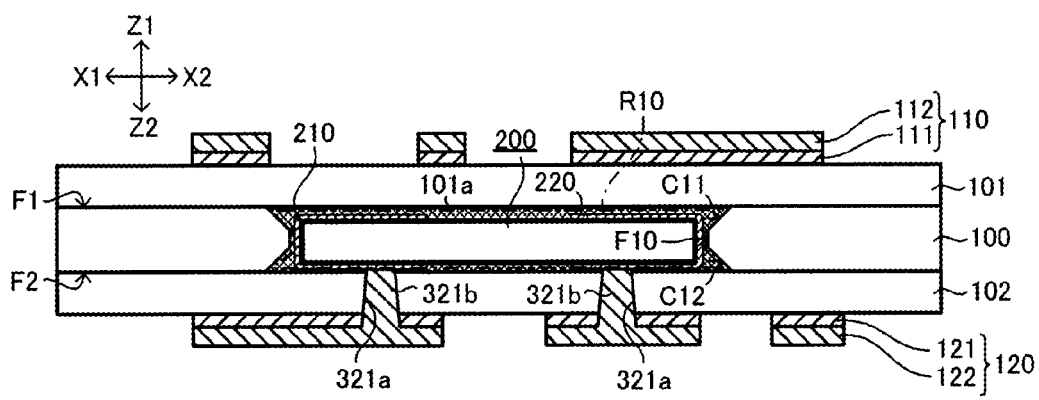
FIG. 28 is a cross-sectional view of a wiring board with a built-in electronic component having tapered surfaces on both sides of a core substrate.

A wiring board may have tapered surfaces on both sides of a core substrate. As shown in FIG. 28, tapered surface (C11) may be formed in a corner of first surface (F1) and side surface (F10) of substrate 100 (inner wall of opening portion R10), while tapered surface (C12) is formed in a corner of second surface (F2) and side surface (F10) of substrate 100 (inner wall of opening portion R10). If tapered surfaces (C11, C12) are formed on both sides of substrate 100, steps such as matching directions (upper/lower) of substrate 100 during the manufacturing process may be omitted.

Figure 29:
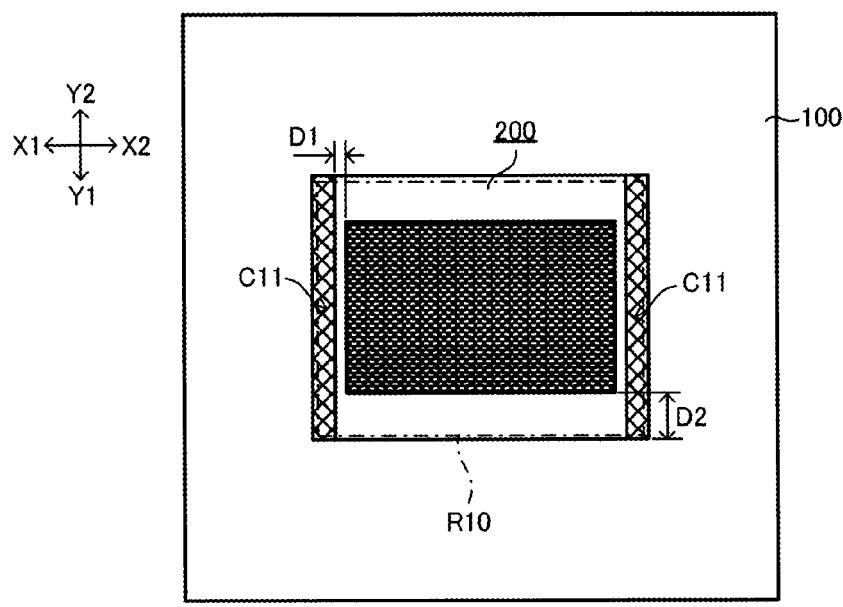
FIG. 29 is a cross-sectional view of a wiring board with a built-in electronic component where a tapered surface is formed on part of the periphery of an opening portion.

In each of the above embodiments, tapered surface (C11) was formed along the entire periphery of opening portion (R10). However, that is not the only option, and as shown in FIG. 29, for example, tapered surface (C11) may be formed partially along the periphery of opening portion (R10). In the example in FIG. 29, clearances to accommodate electronic component 200 in opening portion (R10) are different in a direction X and a direction Y. Along the entire periphery of opening portion (R10) (four sides), tapered surface (C11) is formed only along a portion with a smaller clearance (for example, two sides facing each other).

Figure 30:
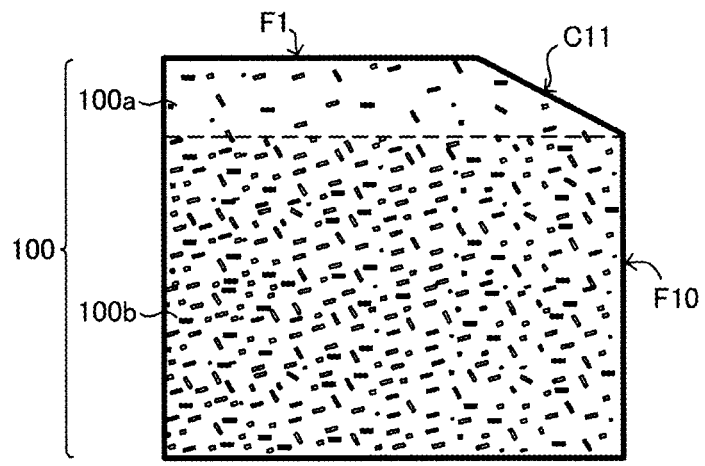
FIG. 30 is a cross-sectional view showing a first example of a first layer and a second layer made of different materials.

In each of above embodiments, first layer (100a) does not contain inorganic material. However, that is not the only option. For example, as shown in FIG. 30, if first layer (100a) contains less inorganic material than second layer (100b), it is easier to form tapered surface (C11).

Figure 31:
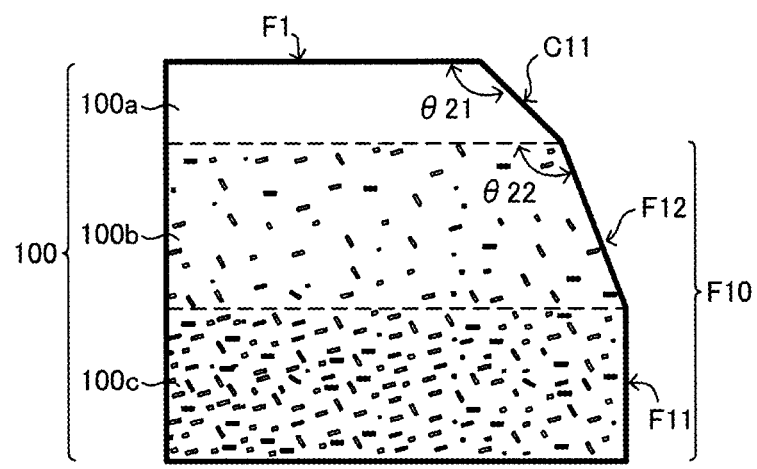
FIG. 31 is a cross-sectional view showing a second example of a first layer and a second layer made of different materials.

Also, substrate 100 may include first layer (100a), second layer (100b) and third layer (100c) with different materials formed from first surface (F1) toward second surface (F2) in that order as shown in FIG. 31, for example. In the example in FIG. 31, first layer (100a) does not contain inorganic material, second layer (100b) contains inorganic material, and third layer (100c) contains more inorganic material than second layer (100b). Side surface (F10) of substrate 100 facing opening portion (R10) is formed with side surface (F12) of second layer (100b) and side surface (F11) of third layer (100c). In the example shown in FIG. 31, taper angle ($\theta 22$) of side surface (F12) is smaller than taper angle ($\theta 21$) of tapered surface (C11).

Figure 32:
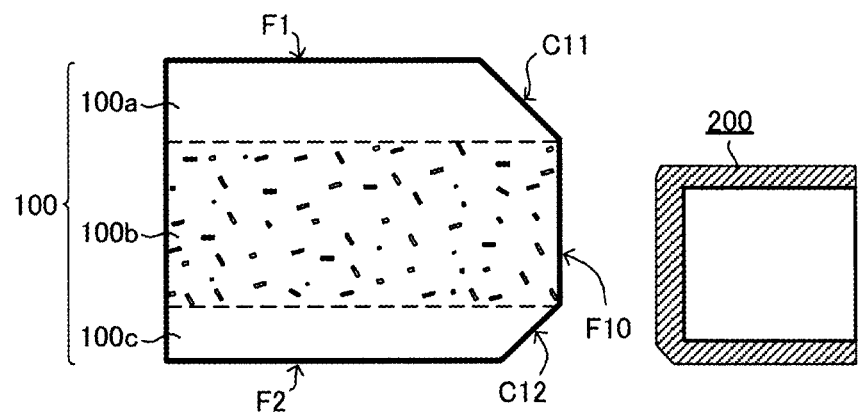
FIG. 32 is a cross-sectional view showing a third example of a first layer and a second layer made of different materials.
Figure 33:
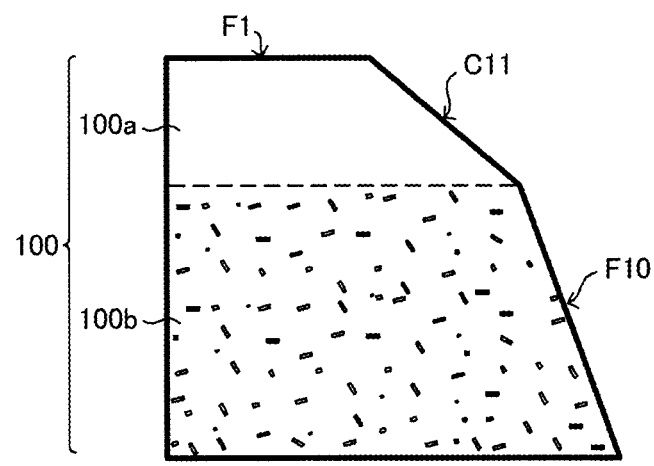
FIG. 33 is a cross-sectional view showing a fourth example of a first layer and a second layer made of different materials.

It may also be a wiring board in which an inner layer of substrate 100 has the greatest amount of inorganic material. For example, as shown in FIG. 32, substrate 100 includes first layer (100a) without inorganic material, second layer (100b) with inorganic material, and third layer (100c) without inorganic material arranged in that order from first surface (F1)

toward second surface (F2). According to such a structure, tapered surfaces (C11, C12) are easier to form on both sides of substrate 100. It is considered preferable for first layer (100a) and third layer (100c) (tapered surfaces (C11, C12)) each to be made thinner than electronic component 200.

Other than the amount of inorganic material, the material of first layer (100a) may be different from the material of second layer (100b). For example, first layer (100a) and second layer (100b) may be made of different resins. In such a case as well, if first layer (100a) is more resistant to processing of substrate 100 (such as laser processing) than second layer (100b), it is easier to form tapered surface (C11).

In each of the above embodiments, a laser is used to form tapered surface (C11). However, that is not the only option, and when dry etching or the like is employed to form tapered surface (C11), it is easier to form tapered surface (C11) by having first layer (100a) and second layer (100b) made of different materials. However, an especially excellent tapered surface (C11) is obtained by laser processing.

Each of the above embodiments showed a wiring board with a built-in electronic component (wiring board 10) where only one electronic component 200 is accommodated in opening portion (R10) (accommodation space for electronic component 200). However, that is not the only option. For example, it may be a wiring board with a built-in electronic component having multiple electronic components 200 in opening portion (R10). Multiple electronic components 200 may be arrayed along a lamination direction (a direction Z) or may be arrayed along a direction X or a direction Y. Alternatively, multiple opening portions (R10) may be formed.

Electrodes (210, 220) of electronic component 200 are not limited to being U-shaped, and they may be a pair of planar electrodes that sandwich capacitor body 201.

The type of electronic component 200 is not limited specifically, and any type of electronic component may be used; for example, it may be a passive component such as a capacitor, resistor or coil, or an active component such as an IC circuit. However, since chip capacitors are easily cracked, it is especially important to suppress cracking while being positioned in opening portion (R10).

Figure 34:
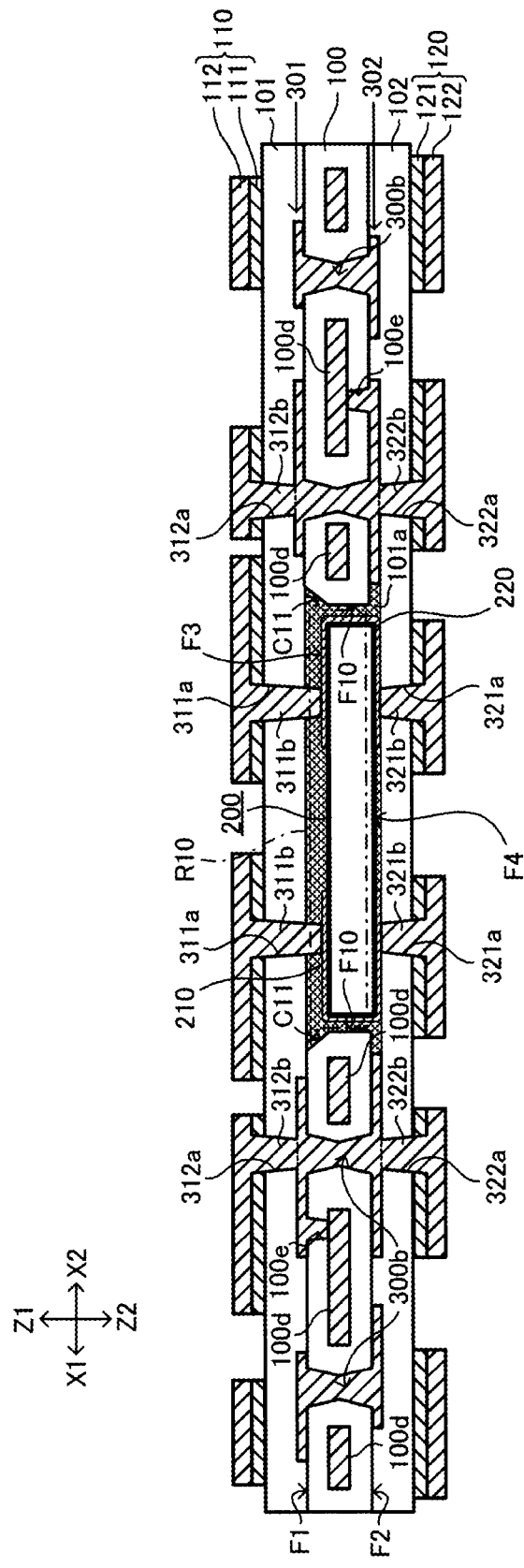
FIG. 34 is a cross-sectional view showing a wiring board with a built-in electronic component having a core substrate with a built-in metal sheet in yet another example of the present invention.

As shown in FIG. 34, substrate 100 (core substrate) may have built-in metal sheet (100d) (such as copper foil). In such substrate 100, heat dissipation is enhanced by metal sheet (100d). In the example in FIG. 34, via conductor (100e) reaching metal sheet (100d) is formed in substrate 100, and metal sheet (100d) and a ground line (conductive pattern included in conductive layer 301 or 302) are electrically connected to each other through via conductor (100e).

A substrate with a built-in metal sheet tends to be thicker than a substrate without a built-in metal sheet. Thus, the substrate with a built-in metal sheet tends to be thicker than an electronic component positioned in an opening portion of the substrate. Also, as the metal sheet to be built into the substrate becomes thicker, the substrate tends to be thicker. As the substrate becomes thicker, the difference tends to be greater between the thickness of the substrate and the thickness of the electronic component.

When the difference increases between the thickness of a substrate and the thickness of an electronic component, a mounter may likely touch the substrate in a step for placing the electronic component in an opening portion formed in the substrate. However, in the wiring board shown in FIG. 34, such interference is suppressed between the mounter and the substrate because of tapered surface (C11) formed in substrate 100. In the following, such a situation is further described with reference to FIGS. 35A-36.

Figure 35A:
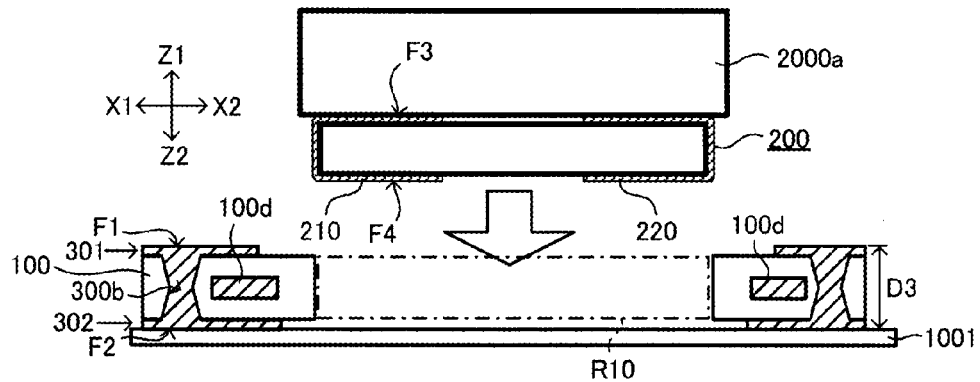
FIG. 35A is, in a manufacturing process for a wiring board formed with a core substrate where a tapered surface is not formed in a corner of an inner wall of an opening portion, a view to illustrate a step for placing an electronic component in the opening portion formed in the core substrate.
Figure 35B:
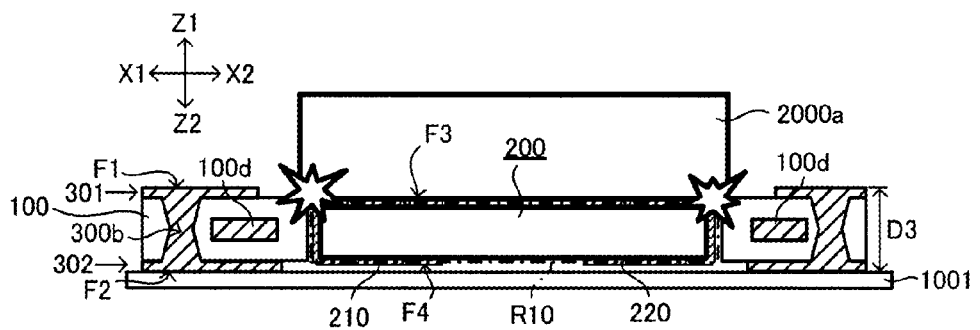
FIG. 35B is a view showing how a mounter interferes with a core substrate in the step in FIG. 35A.

FIG. 35A shows a wiring board formed with substrate 100 (core substrate) where tapered surface (C11) is not formed. When electronic component 200 is positioned in opening portion (R10) formed in substrate 100 during the process for manufacturing such a wiring board, electronic component 200 is held on mounter (2000a) using a vacuum chuck, for example. Mounter (2000a) travels to the area above opening portion (R10) (on the Z1 side), from where mounter (2000a) is gradually lowered toward substrate 100 so that electronic component 200 is placed into opening portion (R10). During that time, electronic component 200 can go through opening portion (R10) since it is smaller than opening portion (R10). However, since mounter (2000a) is not always smaller than opening portion (R10), mounter (2000a) may touch substrate 100 (especially its corner) as shown in FIG. 35B depending on the size of mounter (2000a).

For that matter, in a wiring board shown in FIG. 34, substrate 100 has tapered surface (C11) which reduces the width of opening portion (R10) from first surface (F1) toward second surface (F2) in a corner of first surface (F1) and side surface (F10) of substrate 100 facing opening portion (R10) (inner wall of opening portion R10). Tapered surface (C11) is formed in substrate 100 to bevel a corner of side surface (F10) and first surface (F1) of substrate 100, widening the width of opening portion (R10) on the first-surface (F1) side of substrate 100 where mounter (2000a) tends to cause interference. As a result, mounter (2000a) is unlikely to interfere (make contact) with substrate 100 as shown in FIG. 36.

Figure 36:
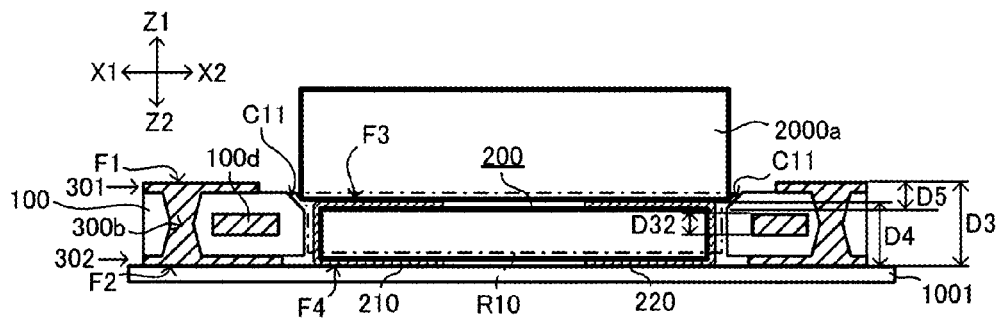
FIG. 36 is, in a process of manufacturing the wiring board shown in FIG. 34, a view to illustrate a step for placing an electronic component in the opening portion formed in the core substrate.

Such interference between mounter (2000a) and substrate 100 tends to occur especially when difference (D3–D4) is approximately 20 μm or greater between thickness (D3) of substrate 100 and thickness (D4) of electronic component 200 in FIG. 36. For that matter, according to a wiring board using substrate 100 with tapered surface (C11), interference is suppressed between mounter (2000a) and substrate 100 as described above. Accordingly, productivity improves when manufacturing a wiring board where difference (D3–D4) is approximately 20 μm or greater between thickness (D3) of substrate 100 and thickness (D4) of electronic component 200.

In addition, to secure heat dissipation or strength, thickness (D32) of metal sheet (100d) is preferred to be approximately 30 μm or greater. However, since substrate 100 tends to be thicker as metal sheet (100d) becomes thicker, mounter (2000a) tends to interfere with substrate 100 during a step for placing electronic component 200 in opening portion (R10). For that matter, regarding a wiring board using substrate 100 with tapered surface (C11), since interference is suppressed between mounter (2000a) and substrate 100 as described above, productivity improves when manufacturing a wiring board with built-in thick metal sheet (100d).

As shown in FIG. 36, tapered surface (C11) is preferred to be formed from first surface (F1) to a deeper point than third surface (F3) of electronic component 200. Namely, depth (D5) of tapered surface (C11) is preferred to be greater than the difference between thickness (D3) of substrate 100 and thickness (D4) of electronic component 200 (D5>D3–D4). In so setting, before mounter (2000a) advances deeper than tapered surface (C11), positioning (accommodating) electronic component 200 tends to be finished. As a result, mounter (2000a) is unlikely to interfere with substrate 100 (especially in a corner).

Following are preferred examples: thickness (D3) of substrate 100 is approximately 180 μm; thickness (D4) of electronic component 200 is approximately 140 μm; depth (D5) of tapered surface (C11) is approximately 40 μm; thickness (D32) of metal sheet (100d) is approximately 35 μm; and difference (D3−D4) is approximately 40 μm between thickness (D3) of substrate 100 and thickness (D4) of electronic component 200.

Figure 37A:
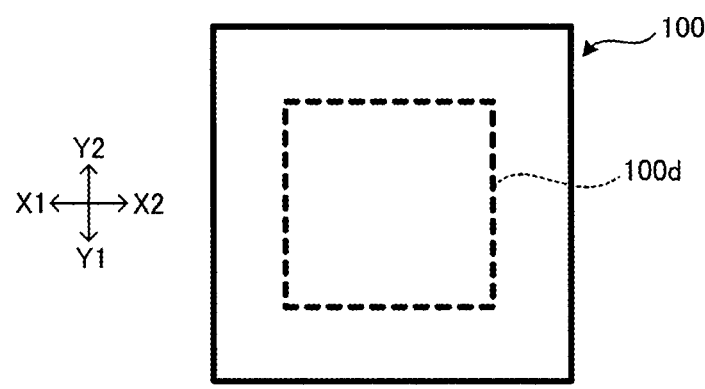
FIG. 37A is a view showing a first shape of a metal sheet used in the wiring board shown in FIG. 34.
Figure 37B:
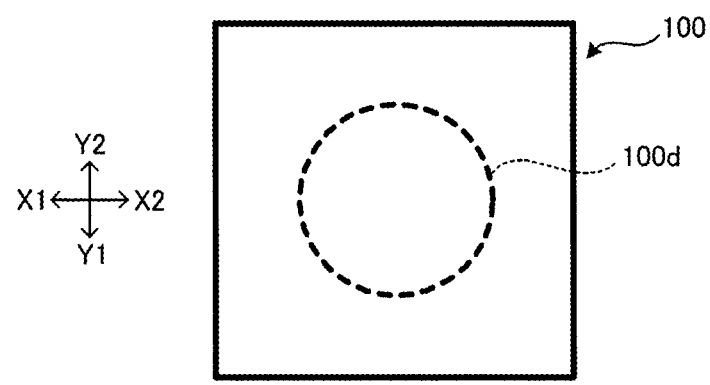
FIG. 37B is a view showing a second shape of the metal sheet used in the wiring board shown in FIG. 34.

The planar shape of metal sheet (100*d*) is not limited specifically; for example, it may be rectangular as shown in FIG. 37A, or it may be circular as shown in FIG. 37B.

Figure 38:
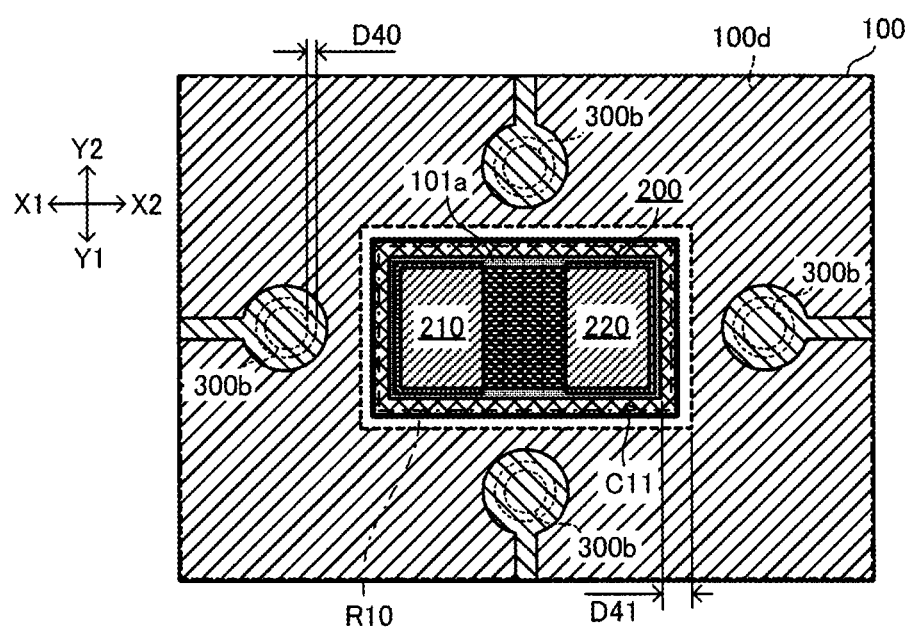
FIG. 38 is, in the wiring board shown in FIG. 34, a view showing a first state of a built-in metal sheet in the wiring board and a conductive layer on the core substrate.

Metal sheet (100*d*) may be formed to surround opening portion (R10) as shown in FIG. 38, for example. In the example in FIG. 38, through-hole conductors (300*b*) are positioned in four sides around opening portion (R10). Land (301*c*) of through-hole conductor (300*b*) and wiring (301*d*) connected to land (301*c*) are formed on substrate 100 (core substrate). Land (301*c*) and wiring (301*d*) are included in conductive layer 301.

In the example in FIG. 38, metal sheet (100*d*) is formed on substantially the entire surface excluding the vicinity of the penetrating portion (opening portion (R10) or through hole (300*a*), etc.) of substrate 100 (core substrate). Metal sheet (100*d*) is formed to avoid the vicinity of the penetrating portion (for example, the range of distance (D40) from the penetrating portion). In addition, conductive layer 301 on substrate 100 (core substrate) is formed to be farther away from opening portion (R10) than metal sheet (100*d*) is. Namely, conductive layer 301 and metal sheet (100*d*) are each formed to avoid the vicinity of opening portion (R10). Moreover, part of metal sheet (100*d*) is positioned between through-hole conductor (300*b*) (or through hole 300*a*) and opening portion (R10).

Figure 39A:
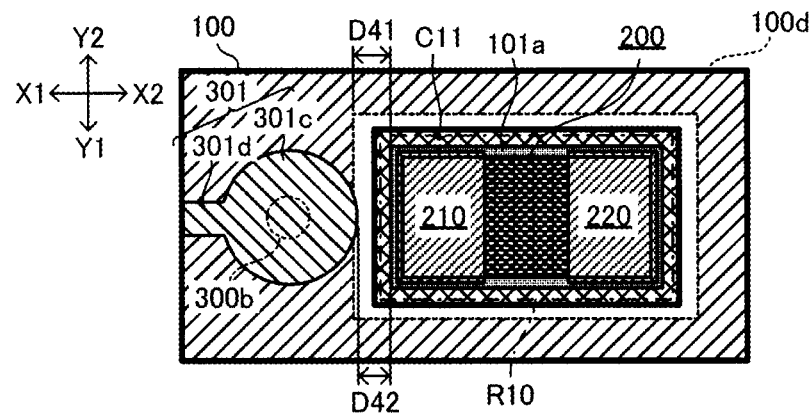
FIG. 39A is, in the wiring board shown in FIG. 34, a view showing a second state of a built-in metal sheet in the wiring board and a conductive layer on the core substrate.
Figure 39B:
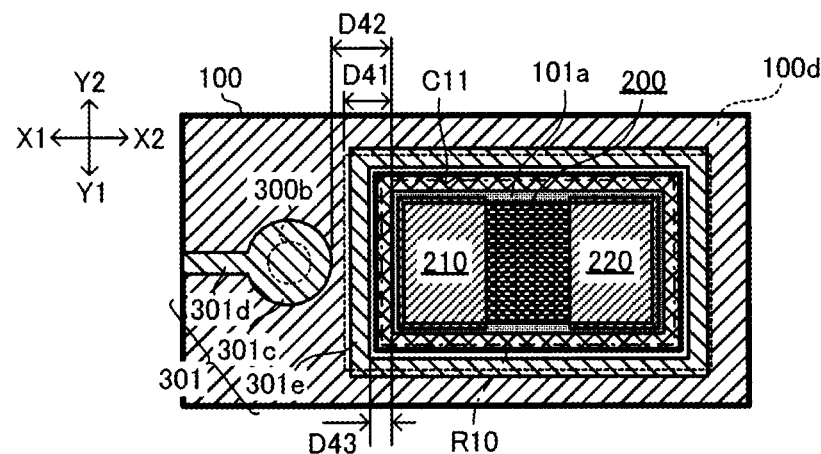
FIG. 39B is, in the wiring board shown in FIG. 34, a view showing a third state of a built-in metal sheet in the wiring board and a conductive layer on the core substrate.
Figure 39C:
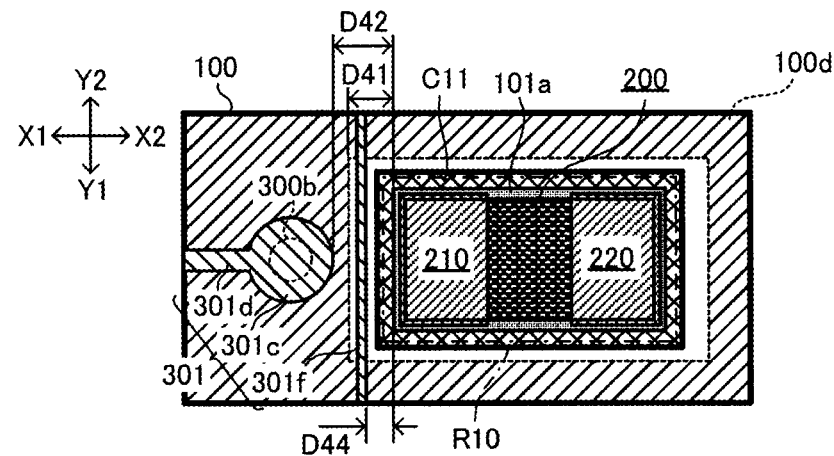
FIG. 39C is, in the wiring board shown in FIG. 34, a view showing a fourth state of a built-in metal sheet in the wiring board and a conductive layer on the core substrate.

Conductive layer 301 on substrate 100 (core substrate) may be formed in a location closer to opening portion (R10) than metal sheet (100*d*) is, as shown in FIG. 39A-39C, for example.

In the example in FIG. 39A, land (301*c*) of through-hole conductor (300*b*) is formed in a location closer to opening portion (R10) than metal sheet (100*d*) is. Namely, distance (D42) between electronic component 200 and land (301*c*) is smaller than distance (D41) between electronic component 200 and metal sheet (100*d*).

In the example in FIG. 39B, reinforcing pattern (301*e*) included in conductive layer 301 is formed in a location closer to opening portion (R10) than metal sheet (100*d*) is. Namely, distance (D43) between electronic component 200 and reinforcing pattern (301*e*) is smaller than distance (D41) between electronic component 200 and metal sheet (100*d*). In the example in FIG. 39B, ring-shaped reinforcing pattern (301*e*) is formed to surround opening portion (R10).

In the example shown in FIG. 39C, wiring pattern (3010 included in conductive layer 301 is formed in a location closer to opening portion (R10) than metal sheet (100*d*) is. Namely, distance (D44) between electronic component 200 and wiring pattern (3010 is smaller than distance (D41) between electronic component 200 and metal sheet (100*d*).

Figure 40A:
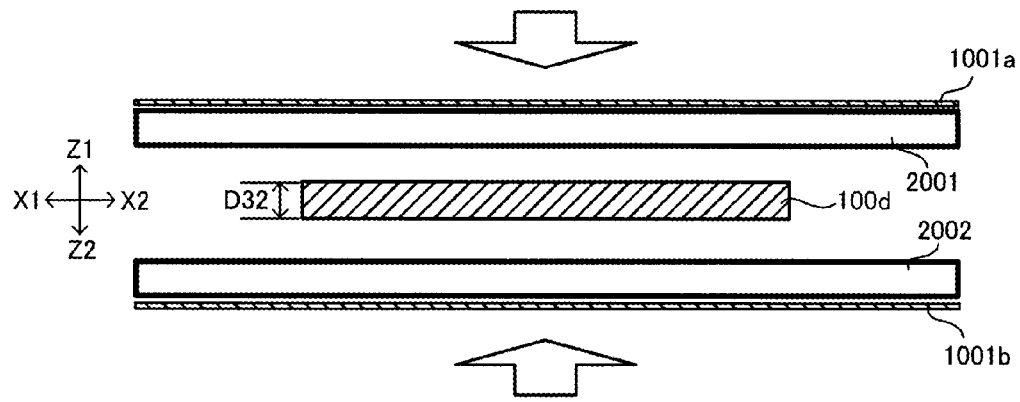
FIG. 40A is a view to illustrate a first step for manufacturing a core substrate to be used in the wiring board shown in FIG. 34.
Figure 40B:
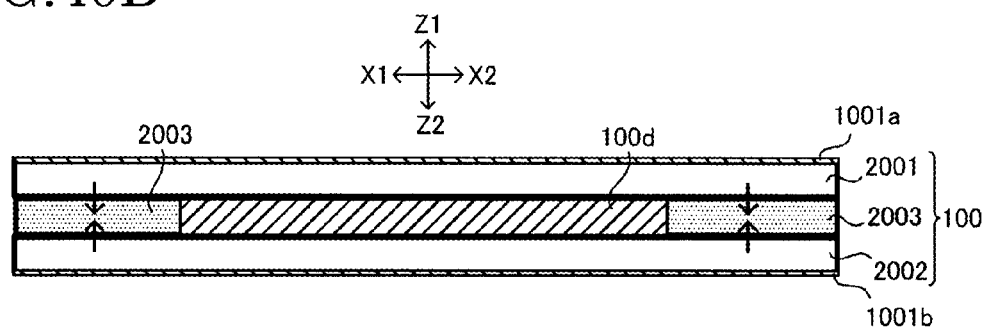
FIG. 40B is a view to illustrate a second step subsequent to the step in FIG. 40A.

In the following, an example of the method for manufacturing substrate 100 (core substrate) shown in FIG. 34 is described with reference to FIGS. 40A and 40B.

Insulation layers (2001, 2002) are positioned to sandwich metal sheet (100*d*) made of copper foil, for example, followed by further positioning copper foil (1001*a*) on insulation layer 2001 and copper foil (1001*b*) on insulation layer 2002. Accordingly, insulation layer 2001 (first resin insulation layer), metal sheet (100*d*) with a predetermined pattern, and insulation layer 2002 (second resin insulation layer) are laminated in that order. Insulation layers (2001, 2002) are each made of glass-epoxy prepreg. Metal sheet (100*d*) has a pattern shown in FIG. 38 (on the X-Y plane), for example.

The laminate of copper foil (1001*a*), insulation layer 2001, metal sheet (100*d*), insulation layer 2002 and copper foil (1001*b*) is pressed so that pressure is added toward metal sheet (100*d*). By pressing semi-cured insulation layers (2001, 2002), resin from insulation layers (2001, 2002) respectively flows out as shown in FIG. 40B. Accordingly, resin from insulation layer 2001 or 2002 is filled in portions at the sides of metal sheet (100*d*) (portions where metal sheet (100*d*) is not present in the pattern of metal sheet (100*d*)), and insulation layer 2003 is formed. Insulation layers (2001, 2002, 2003) are each thermally cured. Accordingly, substrate 100 (core substrate) with built-in metal sheet (100*d*) is completed.

Figure 41:
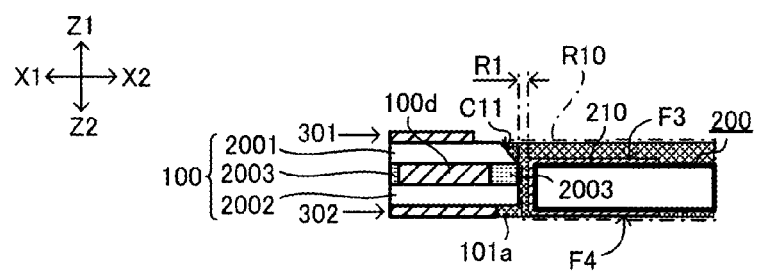
FIG. 41 is, in the wiring board shown in FIG. 34, a view showing the vicinity of a boundary between a core substrate and an electronic component positioned in an opening portion formed in the core substrate.

In a wiring board manufactured as above, as shown in FIG. 41, insulator (101*a*) (first insulator) is filled in clearance (R1) between electronic component 200 in opening portion (R10) and substrate 100 (core substrate), and substrate 100 has insulation layer 2003 (second insulator) between metal sheet (100*d*) and opening portion (R10). Insulation layer 2003 is made of different material from that of insulator (101*a*). In particular, insulator (101*a*) is made of resin from insulation layer 101 or 102 which is formed on substrate 100 and on electronic component 200 and is extended beyond clearance (R1) between electronic component 200 in opening portion (R10) and substrate 100 (see FIG. 16A). On the other hand, insulation layer 2003 is made of resin from insulation layers (2001, 2002) (see FIG. 40B). Here, each resin that forms insulation layers (101, 102) has a lower thermal expansion coefficient (CTE) than each resin that forms insulation layers (2001, 2002). Thus, the thermal expansion coefficient of insulator (101*a*) is set lower than that of insulation layer 2003. Accordingly, CTE mismatching is mitigated between a capacitor and the resin, enhancing adhesiveness between the capacitor and the resin. Insulation layers (101, 102) are each made of epoxy-resin film with inorganic filler (inorganic filler content of 40% or more), for example, and insulation layers (2001, 2002) are each made of prepreg (epoxy-resin sheet containing glass material), for example.

The structures of wiring boards (10, 20) (wiring boards with a built-in electronic component) as well as the type, performance, measurements, quality, shapes, number of layers, positioning and so forth of the elements of such structures, may be modified freely within a scope that does not deviate from the gist of the present invention.

For example, via conductors (321*b*) and the like are not limited to filled conductors, and they may also be conformal conductors, for example.

Mounting electronic component 200 through via connection (via conductors (311*b*, 321*b*)) is not the only option. It may be mounted using other methods such as wire bonding.

The process for manufacturing a wiring board with a built-in electronic component is not limited to the order and contents shown in the above FIG. 7. Its order and contents may be modified within a scope that does not deviate from the gist of the present invention. Also, steps may be omitted if not required, depending on usage or the like.

For example, tapered surface (C11) may be formed either at the same time as forming opening portion (R10), before forming opening portion (R10), or after forming opening portion (R10).

For example, any method may be taken for forming each conductive layer. For example, any one method of the following or any combination of two or more of them may be used for forming conductive layers: panel plating, pattern plating, full-additive, semi-additive (SAP), subtractive, transfer and tenting methods.

Also, instead of a laser, wet or dry etching may be used for processing. When an etching process is employed, it is considered preferable for portions which are not required to be removed to be protected in advance with resist or the like.

Each of the above embodiments and modified examples may be combined freely. Selecting an appropriate combination according to usage requirements or the like is considered preferable. For example, the structure shown in FIG. 22A or FIG. 22B may be applied to any structure shown in FIGS. 23~33. Alternatively, structures shown in FIG. 24, FIG. 28 and the like may be applied to a double-sided via structure (see the second embodiment), for example.

A wiring board with a built-in electronic component according to the present invention has the following: a substrate having a first surface, a second surface opposite the first surface and an opening portion; and an electronic component having a third surface and a fourth surface opposite the third surface and positioned in the opening portion so that the third surface faces the same direction as the first surface of the substrate. In such a wiring board, the electronic component has a curved surface in a corner of its side surface and the fourth surface, and the substrate has a surface that tapers from the first surface toward the second surface in a corner of an inner wall of the opening portion and the first surface.

A method for manufacturing a wiring board with a built-in electronic component according to the present invention includes the following: preparing a substrate having a first surface and a second surface opposite the first surface; preparing an electronic component having a third surface and a fourth surface opposite the third surface, and including a curved surface in a corner of the fourth surface and a side surface; forming an opening portion in the substrate; forming a surface that tapers from the first surface toward the second surface in a corner of an inner wall of the opening portion and the first surface; and positioning the electronic component in the opening portion by setting the third surface in the same direction as the first surface.

The order of each process described in the above manufacturing method does not limit the order of such processes. For example, forming a tapered surface may be conducted at the same time as forming the opening portion, before forming the opening portion, or after forming the opening portion.

Using the embodiment, it is easy to place an electronic component in an opening portion. Also, the clearance is set smaller between the opening portion and the electronic component according to the technology of the present embodiment.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a built-in electronic component, comprising:
a substrate having an opening portion and having a first surface and a second surface on an opposite side of the first surface; and
an electronic component having a third surface and a fourth surface on an opposite side of the third surface and positioned in the opening portion of the substrate such that the third surface faces a same direction as the first surface of the substrate, wherein
the electronic component has a curved surface joining the fourth surface and a side surface of the electronic component, and the opening portion of the substrate is partially tapered and has a tapered portion formed by a tapered surface of the substrate joining an inner wall of the opening portion and the first surface and tapering from the first surface toward the second surface, and
the substrate has a thickness which is larger than a thickness of the electronic component, and the tapered surface is formed from the first surface to a deeper point than the third surface of the electronic component.

2. The wiring board with a built-in electronic component according to claim 1, wherein the opening portion of the substrate has a space formed between the substrate and the electronic component and filled with an insulator.

3. The wiring board with a built-in electronic component according to claim 1, further comprising a resin insulation layer on the substrate and the opening portion, wherein the opening portion of the substrate has a space formed between the substrate and the electronic component and filled with an insulator, and the insulator is made of a resin which forms the insulation layer.

4. The wiring board with a built-in electronic component according to claim 1, wherein the electronic component is a passive component.

5. The wiring board with a built-in electronic component according to claim 1, wherein the electronic component is a chip capacitor.

6. The wiring board with a built-in electronic component according to claim 1, wherein the inner wall of the opening portion is a cut surface formed by a laser.

7. The wiring board with a built-in electronic component according to claim 1, wherein the substrate has a first layer and a second layer, and the first layer and the second layer are made of different materials.

8. The wiring board with a built-in electronic component according to claim 1, wherein the substrate has a first layer and a second layer, the first layer and the second layer are made of different resin materials and are formed in an order of the first layer and the second layer from the first surface toward the second surface, the second layer includes a first amount of an inorganic material, and the first layer includes either no inorganic material or a second amount of an inorganic material which is less than the first amount of the inorganic material in the second layer.

9. The wiring board with a built-in electronic component according to claim 1, wherein the electronic component has an electrode having a surface which forms the curved surface of the electronic component.

10. The wiring board with a built-in electronic component according to claim 9, wherein the electronic component has an electrode having a surface which forms the curved surface of the electronic component, and at least the surface of the electrode of the electronic component is made of a plated film.

11. The wiring board with a built-in electronic component according to claim 1, further comprising an insulation layer on the substrate and on the electronic component, wherein a via conductor is formed in the insulation layer to be electrically connected to an electrode of the electronic component.

12. The wiring board with a built-in electronic component according to claim 1, wherein the inner wall of the opening portion is a plane substantially perpendicular to the second surface.

13. The wiring board with a built-in electronic component according to claim 1, further comprising an insulation layer on the second surface of the substrate, wherein the opening portion is a hole penetrating through the substrate, and the insulation layer covers an opening of the hole.

14. The wiring board with a built-in electronic component according to claim 1, wherein the substrate and the electronic component have a clearance between the substrate and the electronic component, and the clearance has the maximum value in a range of approximately 0 μm to approximately 100 μm.

15. The wiring board with a built-in electronic component according to claim 1, wherein the curved surface has a radius of curvature in a range of approximately 20 μm to approximately 40 μm.

16. The wiring board with a built-in electronic component according to claim 1, wherein the substrate has a thickness which is larger than a thickness of the electronic component, and the thickness of the substrate and the thickness of the electronic component have a difference of approximately 20 μm or greater.

17. The wiring board with a built-in electronic component according to claim 1, wherein the substrate has a built-in metal sheet.

18. The wiring board with a built-in electronic component according to claim 1, wherein the substrate has a built-in metal sheet, and the metal sheet has a thickness which is approximately 30 μm or greater.

19. The wiring board with a built-in electronic component according to claim 1, wherein the substrate has a built-in metal sheet, the electronic component and the substrate have a space between the electronic component and the substrate, the space is filled with a first insulator, the substrate has a second insulator between the metal sheet and the opening portion, and the second insulator is made of a material which is different from a material of the first insulator.

20. The wiring board with a built-in electronic component according to claim 1, wherein the substrate has a built-in metal sheet, the electronic component and the substrate have a space between the electronic component and the substrate, the space is filled with a first insulator, the substrate has a second insulator between the metal sheet and the opening portion, and the first insulator has a thermal expansion coefficient which is lower than a thermal expansion coefficient of the second insulator.

21. The wiring board with a built-in electronic component according to claim 1, further comprising an insulation layer formed on the substrate and the electronic component, wherein the substrate has a built-in metal sheet, the electronic component and the substrate have a space between the electronic component and the substrate, the space is filled with a first insulator, the substrate has a second insulator between the metal sheet and the opening portion, and the first insulator is made of a resin from the insulation layer which extends over the space between the electronic component and the substrate.

22. The wiring board of claim 1, wherein said electronic component includes electrodes on the third surface of the electronic component such that the electrodes face the first surface of the substrate which includes a relatively wider portion of the taper.

* * * * *